(12) United States Patent
Furge et al.

(10) Patent No.: US 8,472,638 B2
(45) Date of Patent: Jun. 25, 2013

(54) SOUND PROCESSING SYSTEM FOR CONFIGURATION OF AUDIO SIGNALS IN A VEHICLE

(75) Inventors: Kenneth Carl Furge, Howell, MI (US);
Bradley F. Eid, Greenwood, IN (US);
Roger E. Shively, Greenwood, IN (US)

(73) Assignee: Harman International Industries, Incorporated, Stamford, CT (US)

( * ) Notice: Subject to any disclaimer, the term of this patent is extended or adjusted under 35 U.S.C. 154(b) by 1337 days.

(21) Appl. No.: 12/197,973

(22) Filed: Aug. 25, 2008

(65) Prior Publication Data
US 2008/0317257 A1 Dec. 25, 2008

Related U.S. Application Data

(60) Division of application No. 10/919,649, filed on Aug. 17, 2004, which is a continuation-in-part of application No. 09/850,500, filed on May 7, 2001, now Pat. No. 6,804,565.

(51) Int. Cl.
*H04B 1/00* (2006.01)
*H04R 5/00* (2006.01)
*H03G 3/00* (2006.01)

(52) U.S. Cl.
USPC ............ 381/86; 381/119; 381/20; 381/310

(58) Field of Classification Search
USPC ............ 381/1, 309, 310, 86, 17–20, 26, 119
See application file for complete search history.

(56) References Cited

U.S. PATENT DOCUMENTS
3,845,572 A 11/1974 McCanney
4,251,688 A 2/1981 Furner
(Continued)

FOREIGN PATENT DOCUMENTS
EP 1 067 680 A2 1/2001
EP 1 387 601 A 2/2004
(Continued)

OTHER PUBLICATIONS
Notification of the Second Office Action from corresponding Chinese Application No. 2005/0090571, dated Aug. 14, 2009 (with full translation) (11 pages).
(Continued)

*Primary Examiner* — Xu Mei
(74) *Attorney, Agent, or Firm* — Brinks Hofer Gilson & Lione

(57) ABSTRACT

A sound processing system for a vehicle includes a sound processor that is configured to mix at least one real audio input signal to form at least one virtual output signal. At least one audio signal that is available to drive at least one loudspeaker may be formed using the combination of the virtual output signal and the real audio input signal. The virtual output signal may be post processed to form a predetermined frequency range of the audio signal prior to being combined with the real audio input signal. The audio signal may be created by mixing the real audio input signal with the post processed virtual output signal. Alternatively, the audio signal may be formed by mixing the real audio input signal to form a real audio output signal, and then summing the real audio output signal with the post processed virtual output signal. Mixing may be performed with a crossbar mixer included in the sound processor.

14 Claims, 8 Drawing Sheets

U.S. PATENT DOCUMENTS

| | | | |
|---|---|---|---|
| 4,382,158 A | 5/1983 | Oshita et al. | |
| 4,641,344 A | 2/1987 | Kasai et al. | 381/57 |
| 4,759,066 A | 7/1988 | Polk et al. | |
| 4,761,814 A | 8/1988 | Sugai et al. | |
| 4,799,260 A | 1/1989 | Mandell et al. | |
| 4,862,502 A | 8/1989 | Griesinger | |
| 4,866,776 A | 9/1989 | Kasai et al. | |
| 4,891,839 A | 1/1990 | Scheiber | |
| 4,905,283 A | 2/1990 | Ishikawa et al. | |
| 4,932,059 A | 6/1990 | Fosgate | |
| 4,940,977 A | 7/1990 | Mandell | |
| 4,941,177 A | 7/1990 | Mandell et al. | |
| 4,953,213 A | 8/1990 | Tasaki et al. | |
| 4,972,482 A | 11/1990 | Ishiguro et al. | |
| 5,046,098 A | 9/1991 | Mandell et al. | |
| 5,109,419 A | 4/1992 | Griesinger | |
| 5,119,422 A | 6/1992 | Price | |
| 5,136,650 A | 8/1992 | Griesinger | 381/22 |
| 5,146,507 A | 9/1992 | Satoh et al. | |
| 5,161,197 A | 11/1992 | Griesinger | |
| 5,172,415 A | 12/1992 | Fosgate | |
| 5,189,703 A | 2/1993 | Holman | |
| 5,199,075 A | 3/1993 | Fosgate | |
| 5,222,143 A | 6/1993 | Min | |
| 5,263,087 A | 11/1993 | Fosgate | |
| 5,274,740 A | 12/1993 | Davis et al. | |
| 5,280,528 A | 1/1994 | Fosgate | |
| 5,295,189 A | 3/1994 | Fosgate | |
| 5,301,237 A | 4/1994 | Fosgate | |
| 5,307,415 A | 4/1994 | Fosgate | |
| 5,319,713 A | 6/1994 | Waller, Jr. et al. | |
| 5,333,201 A | 7/1994 | Waller, Jr. | |
| 5,337,196 A | 8/1994 | Kim | |
| 5,339,363 A | 8/1994 | Fosgate | |
| 5,386,473 A | 1/1995 | Harrison | |
| 5,400,433 A | 3/1995 | Davis et al. | |
| 5,412,732 A | 5/1995 | Kanishi et al. | |
| 5,428,687 A | 6/1995 | Willcocks et al. | |
| 5,463,424 A | 10/1995 | Dressler | |
| 5,467,399 A | 11/1995 | Whitecar | |
| 5,497,425 A | 3/1996 | Rapoport | |
| 5,504,819 A | 4/1996 | Fosgate | |
| 5,524,054 A | 6/1996 | Spille | |
| 5,581,621 A | 12/1996 | Koyama et al. | |
| 5,583,962 A | 12/1996 | Davis et al. | |
| 5,594,800 A | 1/1997 | Gerzon | |
| 5,610,985 A | 3/1997 | Ten Kate | |
| 5,617,480 A | 4/1997 | Ballard et al. | |
| 5,625,696 A | 4/1997 | Fosgate | |
| 5,638,452 A | 6/1997 | Waller, Jr. | |
| 5,642,423 A | 6/1997 | Embree | |
| 5,644,640 A | 7/1997 | Fosgate | |
| 5,666,424 A | 9/1997 | Fosgate et al. | |
| 5,680,468 A | 10/1997 | Van Hout et al. | 381/86 |
| 5,708,719 A | 1/1998 | Greenberger et al. | |
| 5,727,067 A | 3/1998 | Iwamatsu | |
| 5,727,068 A | 3/1998 | Karagosian et al. | |
| 5,748,746 A | 5/1998 | Ozaki et al. | |
| 5,761,313 A | 6/1998 | Schott | |
| 5,768,394 A | 6/1998 | Heo | |
| 5,771,295 A | 6/1998 | Waller et al. | |
| 5,796,844 A | 8/1998 | Griesinger | |
| 5,798,818 A | 8/1998 | Derderian et al. | |
| 5,802,181 A | 9/1998 | Ozaki et al. | |
| 5,841,993 A | 11/1998 | Ho | |
| 5,850,453 A * | 12/1998 | Klayman et al. | 381/1 |
| 5,850,455 A | 12/1998 | Arnold et al. | |
| 5,862,228 A | 1/1999 | Davis | |
| 5,870,480 A | 2/1999 | Griesinger | |
| 5,930,370 A | 7/1999 | Ruzicka | |
| 5,974,380 A | 10/1999 | Smyth et al. | |
| 5,983,087 A | 11/1999 | Milne et al. | |
| 6,032,081 A | 2/2000 | Han et al. | |
| 6,038,324 A | 3/2000 | Ambourn | |
| 6,108,584 A | 8/2000 | Edwards | |
| 6,118,876 A | 9/2000 | Ruzicka | |
| 6,122,381 A | 9/2000 | Winterer | |
| 6,141,597 A | 10/2000 | Botzko et al. | |
| 6,144,747 A | 11/2000 | Scofield et al. | |
| 6,150,597 A | 11/2000 | Kakishita et al. | |
| 6,157,725 A | 12/2000 | Becker | |
| 6,198,826 B1 | 3/2001 | Cowieson et al. | |
| 6,332,026 B1 | 12/2001 | Kuusama et al. | |
| 6,363,155 B1 | 3/2002 | Horbach | 381/17 |
| 6,442,277 B1 | 8/2002 | Lueck et al. | |
| 6,442,278 B1 | 8/2002 | Vaudrey et al. | |
| 6,453,047 B1 | 9/2002 | Dicker et al. | |
| 6,466,913 B1 | 10/2002 | Yasuda et al. | |
| 6,470,087 B1 | 10/2002 | Heo et al. | |
| 6,496,584 B2 | 12/2002 | Irwan et al. | |
| 6,498,856 B1 | 12/2002 | Itabashi et al. | |
| 6,501,717 B1 | 12/2002 | Yamazaki | |
| 6,501,843 B2 | 12/2002 | Usui et al. | |
| 6,539,357 B1 | 3/2003 | Sinha | |
| 6,556,685 B1 | 4/2003 | Urry et al. | |
| 6,577,736 B1 | 6/2003 | Clemow | |
| 6,587,565 B1 * | 7/2003 | Choi | 381/98 |
| 6,590,983 B1 | 7/2003 | Kraemer | |
| 6,611,212 B1 | 8/2003 | Craven et al. | |
| 6,624,873 B1 | 9/2003 | Callahan, Jr. et al. | |
| 6,636,608 B1 | 10/2003 | Kishii et al. | |
| 6,639,989 B1 | 10/2003 | Zacharaov et al. | |
| 6,650,755 B2 | 11/2003 | Vaudrey et al. | |
| 6,683,962 B1 | 1/2004 | Griesinger | |
| 6,694,027 B1 | 2/2004 | Schneider | |
| 6,697,491 B1 | 2/2004 | Griesinger | |
| 6,711,266 B1 | 3/2004 | Aylward | |
| 6,760,448 B1 | 7/2004 | Gundry | |
| 6,804,565 B2 | 10/2004 | Eid | |
| 6,816,597 B1 | 11/2004 | Kawano | |
| 6,829,576 B2 | 12/2004 | Tsai et al. | |
| 6,850,622 B2 | 2/2005 | Maejima | |
| 6,853,732 B2 | 2/2005 | Scofield | |
| 6,928,168 B2 | 8/2005 | Kirkeby | 381/1 |
| 6,996,239 B2 | 2/2006 | Wood | |
| 7,003,119 B1 | 2/2006 | Arthur | |
| 7,031,905 B2 | 4/2006 | Tanaka et al. | |
| 7,065,217 B2 | 6/2006 | Gierl et al. | |
| 7,107,211 B2 | 9/2006 | Griesinger | |
| 7,177,432 B2 | 2/2007 | Eid et al. | |
| 7,206,413 B2 | 4/2007 | Eid et al. | |
| 7,415,120 B1 | 8/2008 | Vaudrey et al. | 381/82 |
| 7,447,321 B2 | 11/2008 | Furge et al. | 381/86 |
| 7,451,006 B2 | 11/2008 | Eid et al. | 700/94 |
| 7,577,260 B1 | 8/2009 | Hooley et al. | 381/77 |
| 7,760,890 B2 | 7/2010 | Furge et al. | 381/86 |
| 8,031,879 B2 | 10/2011 | Eid et al. | 381/86 |
| 2002/0055796 A1 | 5/2002 | Katayama et al. | |
| 2002/0154783 A1 | 10/2002 | Fincham | 381/17 |
| 2003/0040822 A1 | 2/2003 | Eid et al. | |
| 2003/0206639 A1 | 11/2003 | Griesinger | |
| 2004/0005064 A1 | 1/2004 | Griesinger | |
| 2004/0005065 A1 | 1/2004 | Griesinger | |
| 2004/0022392 A1 | 2/2004 | Griesinger | |
| 2004/0086130 A1 | 5/2004 | Eid et al. | |
| 2004/0179697 A1 | 9/2004 | Griesinger | |
| 2005/0018860 A1 | 1/2005 | Furge et al. | |
| 2005/0031128 A1 | 2/2005 | Tomita et al. | |
| 2005/0063551 A1 | 3/2005 | Cheng et al. | |
| 2005/0100178 A1 | 5/2005 | Rybicki et al. | |
| 2006/0088175 A1 | 4/2006 | Eid et al. | |
| 2008/0319564 A1 | 12/2008 | Furge et al. | 700/94 |
| 2009/0220112 A1 | 9/2009 | Fincham | 381/302 |

FOREIGN PATENT DOCUMENTS

| | | |
|---|---|---|
| EP | 1 389 892 A2 | 2/2004 |
| EP | 1 387 601 A2 | 4/2004 |
| JP | 57-003498 | 1/1982 |
| JP | 60-145714 | 8/1985 |
| JP | 63-114599 | 5/1988 |
| JP | 63-177699 | 7/1988 |
| JP | 01-144900 | 7/1989 |
| JP | 04-035499 | 6/1992 |
| JP | 05-038000 | 2/1993 |
| JP | 06-500898 | 1/1994 |
| JP | 6-311581 | 4/1994 |
| JP | 6-311589 | 4/1994 |

| | | |
|---|---|---|
| JP | 08-213861 | 8/1996 |
| JP | 09-062271 | 3/1997 |
| JP | 10-011078 | 1/1998 |
| JP | 2002-118897 | 4/2002 |
| JP | 2002-151975 | 5/2002 |
| JP | 2002199487 | 7/2002 |
| JP | 2003-009300 | 1/2003 |
| JP | 2003-510924 | 3/2003 |
| JP | 2003-299181 | 10/2003 |
| JP | 2004-166240 | 6/2004 |
| WO | WO 00/47018 | 8/2000 |
| WO | WO 02/091798 A2 | 11/2002 |
| WO | WO 02/091798 A3 | 11/2003 |

OTHER PUBLICATIONS

Japanese Office Action dated Jan. 9, 2009, for Japanese Patent Application No. 2005-235566 with English translation, 5 pgs.

Japanese Office Action, dated Feb. 9, 2012, pp. 1-8, Japanese Patent Application No. 2010-101527, Japanese Patent Office, Japan.

"Surround Sound Past, Present and Future," A history of multichannel audio from mag strip to Dolby Digital, pp. 1-8, 1999, (8 pgs.).

Griesinger, David, "Practical Processors and Programs for Digital Reverberation," *Proceedings of the AES 7th International Conference, Audio Engineering Society*, Toronto, May 1989, pp. 187-195, (11 pgs.).

Griesinger, David, "Multichannel Matrix Surround Decoders for Two-Eared Listeners," *Presented at the 101st Convention of the Audio Engineering Society*, Los Angeles, Nov. 8-11, 1996, Preprint #4402, 21 pages, (12 pgs.).

Griesinger, David, "Spaciousness and Envelopment in Musical Acoustics," *Presented at the 101st Convention of the Audio Engineering Society*, Los Angeles, Nov. 8-11, 1996, Preprint #4401, (13 pgs.).

Griesinger, David, "Speaker Placement, Externalization, and Envelopment in Home Listening Rooms," *Presented at the 105th Convention of the Audio Engineering Society*, San Francisco, 1998, Preprint #4860, (25 pgs.).

Griesinger, David, "General Overivew of Spatial Impression, Envelopment, Localization, and Externalization," *Proceedings of the 15th International Conference of the Audio Engineering Society on Small Room Acoustics*, Denmark, Oct. 31-Nov. 2, 1998, pp. 136-149, (15 pgs.).

Griesinger, David, "Theory and Design of a Digital Audio Processor fro Home Use," *J. Audio Eng. Soc.*, vol. 37 No. 1/2, 1989, pp. 40-50, (13 pgs.).

Griesinger, David, "Binaural Techniques for Music Reproduction," *Proceedings of the 8th International Conference of the Audio Engineering Society*, 1990, pp. 197-207, (12 pgs.).

Griesinger, David, "Improving Room Acoustics Through Time Variant Synthetic Reverberation," *Presented at the 90th Convention of the Audio Engineering Society*, Paris, Feb. 1991, reprint #3014, (15 pgs.).

Griesinger, David, "Room Impression Reverberance and Warmth in Rooms and Halls," *Presented at the 93rd Convention of the Audio Engineering Society*, San Francisco, Nov. 1992, Preprint #3383, (8 pgs.).

Griesinger, David, "Measures of Spatial Impression and Reverberance based on the Physiology of Human Hearing," Proceedings of the 11th International Audio Engineering Society Conference, May 1992, pp. 114-145, (33 pgs.).

Griesinger, David, "IALF—Binaural Measures of Spatial Impression and Running Reverberance," *Presented at the 92nd Convention of the Audio Engineering Society*, Mar. 1992, Preprint #3292, (23 pgs.).

Griesinger, David, "Stereo and Surround Panning in Practice," *Presented at the 112th Convention of the Audio Engineering Society*, Munich, May 2002, (6 pgs.).

Griesinger, David, "Progess in 5-2-5 Matrix Systems," *Presented at the 103rd Convention of the Audio Engineering Society*, New York, Sep. 1997, (18 pgs.).

Griesinger, David, "Multichannel Sound Systems and Their Interaction with the Room," *Presented at the 15th International Conference of the Audio Engineering Society*, Copenhagen, Oct. 1998, pp. 159-173, (16 pgs.).

Griesinger, David, "How Loud is My Reverberation?," *Presented at the 98th Convention of the Audio Engineering Society*, Paris, Feb. 1995, (7 pgs.).

Griesinger, David, "Spaciousness and Localization in Listening Rooms and Their Effects on the Recording Technique," *J. Audio Eng. Soc.*, vol. 34, No. 4, 1986, pp. 255-268,(16 pgs.).

Griesinger, David, "The Psychoacoustics of Apparent Source Width, Spaciousness, and Envelopment in Performance Spaces," *Acta Acoustics*, vol. 83, 1997, pp. 721-731, (11 pgs.).

Griesinger, David, "Surround: The Current Technological Situation," *SMPTE Journal*, 2001, pp. 857-866, (12 pgs.).

Griesinger, David, "Feedback Reduction and Acoustic Enhancement Using an Inexpensive Digital Sound Processor," *Presented at the 15th International Congress on Acoustics*, Trondheim, Jun. 1995, pp. 473-476, (5 pgs.).

Griesinger, David, "The Science of Surround," *Presentation material from a speech given at McGill University*, copyright by David Griesinger, Sep. 1999, (70 pgs.).

Griesinger, David, "Recent Experiences With Electronic Acoustic Enhancement in Concert Halls and Opera Houses," material from David Griesinger's Internet Home Page, obtained from the Internet at: <www.world.std.com/~griesngr . . . >, undated but prior to May 2002, (9 pgs.).

Griesinger, David, "The Theory and Practice of Perceptual Modeling—How to Use Electronic Reverberation to Add Depth and Envelopment Without Reducing Clarity," material from David Griesinger's Internet Home Page, obtained from the Internet at: <www.world.std.com/~griesngr . . . >, undated but prior to May 2002, (28 pgs.).

Griesinger, David, "Internet Home Page," obtained from the Internet at: <www.world.std.com/~griesnger/>, printed on Apr. 26, 2004, (9 pgs.).

Japanese Office Action, dated May 13, 2008 (with full translation).

Search Report dated Dec. 1, 2010, in corresponding European Application No. 10178796.8.

\* cited by examiner

SOUND PROCESSING SYSTEM FOR CONFIGURATION OF AUDIO SIGNALS IN A VEHICLE

PRIORITY CLAIM

The present patent document is a divisional of U.S. patent application Ser. No. 10/919,649, filed Aug. 17, 2004, which was a continuation-in-part of U.S. patent application Ser. No. 09/850,500, filed May 7, 2001. The disclosure of the above patent applications are incorporated herein by reference.

BACKGROUND OF THE INVENTION

1. Technical Field

The invention generally relates to sound processing systems. More particularly, the invention relates to sound processing systems that configure audio signals to drive loudspeakers in a vehicle to maximize the frequency range of the audio output.

2. Related Art

Audio or sound system designs involve the consideration of many different factors. The position and number of speakers, the frequency response of each speaker, and other factors usually are considered in the design. Some factors may be more pronounced in the design than others in various applications such as inside a vehicle. For example, the desired frequency response of a speaker located on an instrument panel of a vehicle usually is different from the desired frequency response of a speaker located in the lower portion of a rear door panel. Other factors also may be more pronounced.

Consumer expectations of sound quality are increasing. In some applications, such as inside a vehicle, consumer expectations of sound quality have increased dramatically over the last decade. Consumers now expect high quality sound systems in their vehicles. The number of potential audio sources has increased also to include radios (AM, FM, and satellite), compact discs (CD) and their derivatives, digital video discs (DVD) and their derivatives, super audio compact discs (SACD) and their derivatives, tape players, and the like. Also, the audio quality of these components is an important feature. Moreover, many vehicle audio systems employ advanced signal processing techniques to customize the listening environment. Some vehicle audio systems incorporate audio or sound processing that is similar to surround sound systems offered in home theater systems.

Many digital sound processing formats support direct encoding and playback of five or more discrete channels. However, most recorded material is provided in traditional two-channel stereo mode. Matrix sound processors synthesize four or more output signals from a pair of input signals—generally left and right. Many systems have five channels—center, left-front, right-front, left-surround, and right-surround. Some systems have seven or more channels—center, left-front, right-front, left-side, right-side, left-rear, and right-rear. Other outputs, such as a separate subwoofer channel, may also be included.

In general, matrix decoders mathematically describe or represent various combinations of input audio signals in an N×2 or other matrix, where N is the number of desired outputs. The matrix usually includes 2N matrix coefficients that define the proportion of the left and/or right input audio signals for a particular output signal. Typically, these surround sound processors can transform M input channels into N output channels using an M×N matrix of coefficients.

Many audio environments, such as the listening environment inside a vehicle, are significantly different from a home theater environment. Most home theater systems are not designed to operate with the added complexities inside of a vehicle. The complexities include the complexity of outside sounds, such as road noise, wind noise, etc. In addition, vehicle listening environments may have non-optimal loudspeaker placement coupled with loudspeakers with various frequency response ranges. A vehicle and similar environments are typically more confined than rooms containing home theatre systems. The loudspeakers in a vehicle usually are in closer proximity to the listener. Typically, there is less control over loudspeaker placement in relation to the listener as compared to a home theater or similar environment where it is relatively easy to place each loudspeaker the same approximate distance from the listeners.

In contrast, it is nearly impossible in a vehicle to place each loudspeaker the same distance from the listeners when one considers the front and rear seating positions and their close proximity to the doors, as well as the kick-panels, dash, pillars, and other interior vehicle surfaces that could contain the loudspeakers. These placement restrictions are problematic considering the short distances available in an automobile for sound to disperse before reaching the listeners. In addition, the placement restrictions can also dictate the size and the optimal range of frequency response of the loudspeakers that are installed. Accordingly, a sound processing system is needed that can compensate for loudspeaker placement and provide signals to drive the loudspeakers within their respective ranges of frequency under varying operation conditions within a vehicle to optimize the frequency range of the audio output within the vehicle.

SUMMARY

This invention provides a sound processing system that includes a sound processor configured to mix real audio input signals to produce at least one virtual output signal on at least one virtual output channel. In addition, the sound processor is configured to produce real audio output signals on real audio output channels using at least one of the real audio input signals and the virtual output signal. The real audio output signals may be provided as an audio signal on an output signal line. The audio signals may be amplified and used to drive transducers, such as loudspeakers to produce an audio output that maximizes the frequency range of the audio output within a vehicle.

The sound processor includes a pre-processor block and a mixing block. The pre-processor block may process the incoming real audio input signals, and provide the pre-processed real audio input signals to the mixing block. The mixing block includes a crossbar mixer (or crossbar matrix mixer) and a post processing block.

The crossbar mixer is configurable to generate real audio output signals and at least one virtual output signal as outputs. The crossbar mixer may form the virtual output signal by mixing or combining one or more of the real audio input signals. The real audio output signals may also be formed by the crossbar mixer by mixing or combining one or more of the real audio input signals. Alternatively, the crossbar mixer may form the real audio output signals by mixing the virtual output signal and one or more of the real audio input signals. The crossbar mixer may also be configured to generate multiple virtual output signals based on mixing one or more of the real audio input signals and/or one or more of the other virtual output signals.

The post processor block may include a real post processor block and a virtual post processor block to process the real audio output signals and the virtual output signal(s), respectively. Processing by the real and virtual post processor blocks may include filtering, delay, etc. of the respective real audio output signals and the virtual output signal.

When the crossbar mixer is configured to mix the real audio input signals and the virtual output signals to form the real audio output signals, the virtual post processor block may process the virtual output signal to produce a feedback input signal on a feedback channel. The feedback input signal may be provided as an input to the crossbar mixer. The crossbar mixer may mix the feedback input signal with one or more of the real audio input signals to form one or more of the real audio output signals. The real audio output signal(s) may then be post processed and provided as audio signal(s) to drive a loudspeaker.

When the crossbar matrix mixer mixes the real audio input signal(s) to form the real audio output signals, the real audio output signals may be post processed with the real post processors. In addition, the virtual output signal may be post processed with the virtual processor block. Following post processing, the real audio output signals and the virtual output signals may be combined using one or more summers also included in the post processing block. The summers may sum the post processed virtual output signal with one or more of the post processed real audio output signals to form the audio signal(s) that are available to drive a loudspeaker.

The post processor block may also include a signal magnitude control block. The signal magnitude control block may provide zone control and/or volume control of the virtual output signal and/or the real audio output signals. The zone control may include balance and fade control.

In some applications, the sound processor may provide a bass summing function to maximize the frequency range of the audio output. The bass summing function may be implemented by forming the virtual output signal from one or more of the real audio input signals, and filtering the virtual output signal with the virtual post processor block to extract a predetermined range of frequency, in this case a low frequency range signal. The post processed virtual output signal may then be included in the real audio output signals.

The post processed virtual output signal may be included by the sound processor in such a way that when one or more of the audio signals available to drive loudspeakers are otherwise attenuated, the virtual output signal is still provided as an audio signal to drive the loudspeaker(s) subject to the attenuated audio signal(s). For example, if a zone control included in the signal magnitude control block is adjusted to fade a right rear loudspeaker that is a woofer, the audio signal provided to the right rear loudspeaker may be attenuated except for the feedback input signal (or the post processed virtual output signal). Accordingly, the right rear loudspeaker may be driven by an audio signal that is only the virtual output signal to produce a relatively low frequency audio output.

The virtual output signal is produced from the same real audio input signal(s) that produce the remaining non-attenuated audio signal(s) that are still available to drive respective other loudspeakers. Thus, a predetermined frequency range of one or more of the remaining non-attenuated audio signals is the audio signal driving the right rear loudspeaker.

In other applications, the sound processor may provide separate processing for different frequency bands of a single audio signal used to drive a single loudspeaker that includes multiple transducers. For example, a single loudspeaker to be driven may include a low frequency transducer, such as a woofer and a high frequency transducer, such as a tweeter. One or more real audio input signals may be processed to produce one or more real audio output signals, and one or more virtual output signals. A real audio output signal may be filtered to a predetermined frequency range, such as a low frequency range to drive a transducer such as a woofer loudspeaker. A virtual output signal may be filtered to a predetermined frequency range, such as a high frequency range to drive a transducer such as a tweeter loudspeaker. The real audio output signal and the virtual output signal may be post-processed separately. Post-processing may include implementing different delays. Following post processing, the real audio output signal and the virtual output signal may combined and provided as one audio signal on one channel to drive a single loudspeaker that includes multiple transducers, such as a woofer and a tweeter.

The separate processing of the different frequency bands may be used to control the phase relationship of the different predetermined frequency ranges in the audio signal. Accordingly, effects on the listening experience of a user may be implemented, such as the point of origination of the audible sound emitted from the transducers may be separately adjusted. In addition, the timing of when the predetermined frequency bands reach the user may be adjusted. Other enhancements and adjustments of the audible signal produced by a loudspeaker also may be provided by separate and independent adjustment of the phase delay between the frequency bands of an audio signal used to drive the loudspeaker.

Other systems, methods, features and advantages of the invention will be, or will become, apparent to one with skill in the art upon examination of the following figures and detailed description. It is intended that all such additional systems, methods, features and advantages be included within the description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like references numerals designate corresponding parts throughout the different views.

DETAILED DESCRIPTION OF THE PREFERRED EMBODIMENTS

Figure 1:
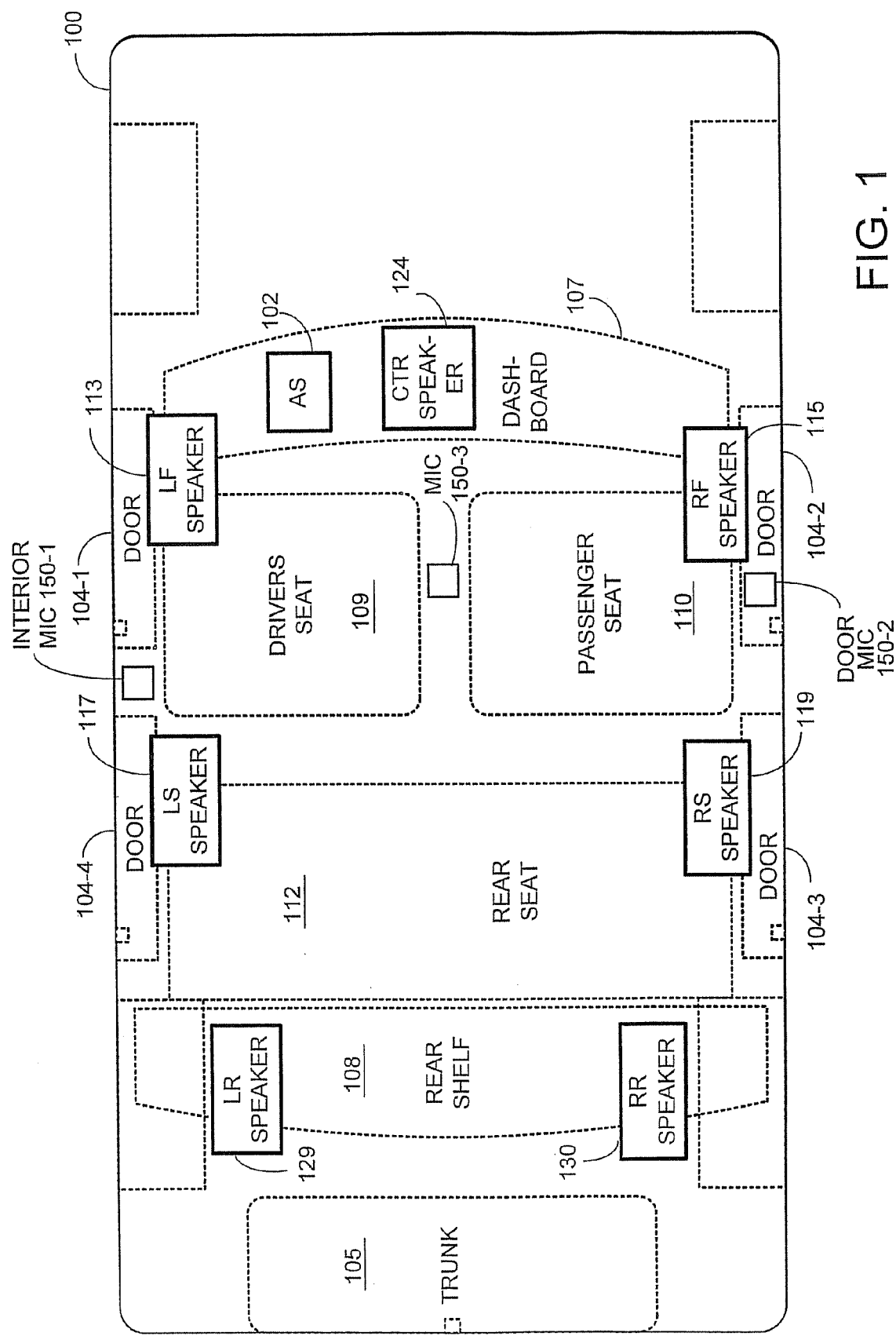
FIG. 1 is a block diagram of a vehicle including a sound processing system.

FIG. 1 is a block diagram of a vehicle 100 that includes an example audio or sound processing system (AS) 102, which may include any or a combination of the sound processing systems and methods described below. The vehicle 100 includes doors 104, a driver seat 109, a passenger seat 110, and a rear seat 111. While a four-door vehicle is shown including doors 104-1, 104-2, 104-3, and 104-4, the audio system (AS) 102 may be used in vehicles having more or fewer doors. The vehicle 100 may be an automobile, truck, boat, or the like. Although only one rear seat is shown, larger vehicles may have multiple rows of rear seats. Smaller vehicles may have only one or more seats. While a particular example configuration is shown, other configurations may be used including those with fewer or additional components.

The audio system 102 may improve the spatial characteristics of surround sound systems. The audio system 102 supports the use of a variety of audio components such as radios, CDs, DVDs, their derivatives, and the like. The audio system 102 may use 2-channel source material such as direct left and right, 5.1 channel, 6.2 channel, 7 channel, and/or any other source materials from a matrix decoder digitally encoded/decoded discrete source material, and the like. The amplitude and phase characteristics of the source material and the reproduction of specific sound field characteristics in the listening environment both play a key role in the successful reproduction of a surround sound field.

The audio system 102 may improve the reproduction of a surround sound field by controlling the amplitude, phase, and mixing ratios between discrete and passive decoder surround signals and/or the direct two-channel output signals. The amplitude, phase, and mixing ratios may be controlled between the discrete and passive decoder output signals. The spatial sound field reproduction may be improved for all seating locations by re-orientation of the direct, passive, and active mixing and steering parameters, especially in a vehicle environment. The mixing and steering ratios as well as spectral characteristics may be adaptively modified as a function of the noise and other environmental factors. In a vehicle, information from the data bus, microphones, and other transduction devices may be used to control the mixing and steering parameters.

The vehicle 100 has a front center speaker (CTR speaker) 124, a left front speaker (LF speaker) 113, a right front speaker (RF speaker) 115, and at least one pair of surround speakers. The surround speakers can be a left side speaker (LS speaker) 117 and a right side speaker (RS speaker) 119, a left rear speaker (LR speaker) 129 and a right rear speaker (RR speaker) 130, or a combination of speaker sets. Other speaker sets may be used. While not shown, one or more dedicated subwoofers or other drivers may be present. Possible subwoofer mounting locations include the trunk 105, below a seat (not shown), or the rear shelf 108. The vehicle 100 may also have one or more microphones 150 mounted in the interior.

Each CTR speaker, LF speaker, RF speaker, LS speaker, RS speaker, LR speaker, and RR speaker may include one or more transducers of a predetermined range of frequency response such as a tweeter, a mid-range or a woofer. The tweeter, mid-range or woofer may be mounted adjacent to each other in essentially the same location or in different locations. For example, the LF speaker 113 may be a tweeter located in door 104-1 or elsewhere at a height roughly equivalent to a side mirror or higher. The LF speaker 113 may have a similar arrangement. The LR speaker 129 and the RR speaker 130 may each be a woofer mounted in the rear shelf 108. The CTR speaker 124 may be mounted in the front dashboard 107, but could be mounted in the roof, on or near the rear-view mirror, or elsewhere in the vehicle 100. In other examples, other configurations of loudspeakers with other frequency response ranges are possible.

Figure 2:
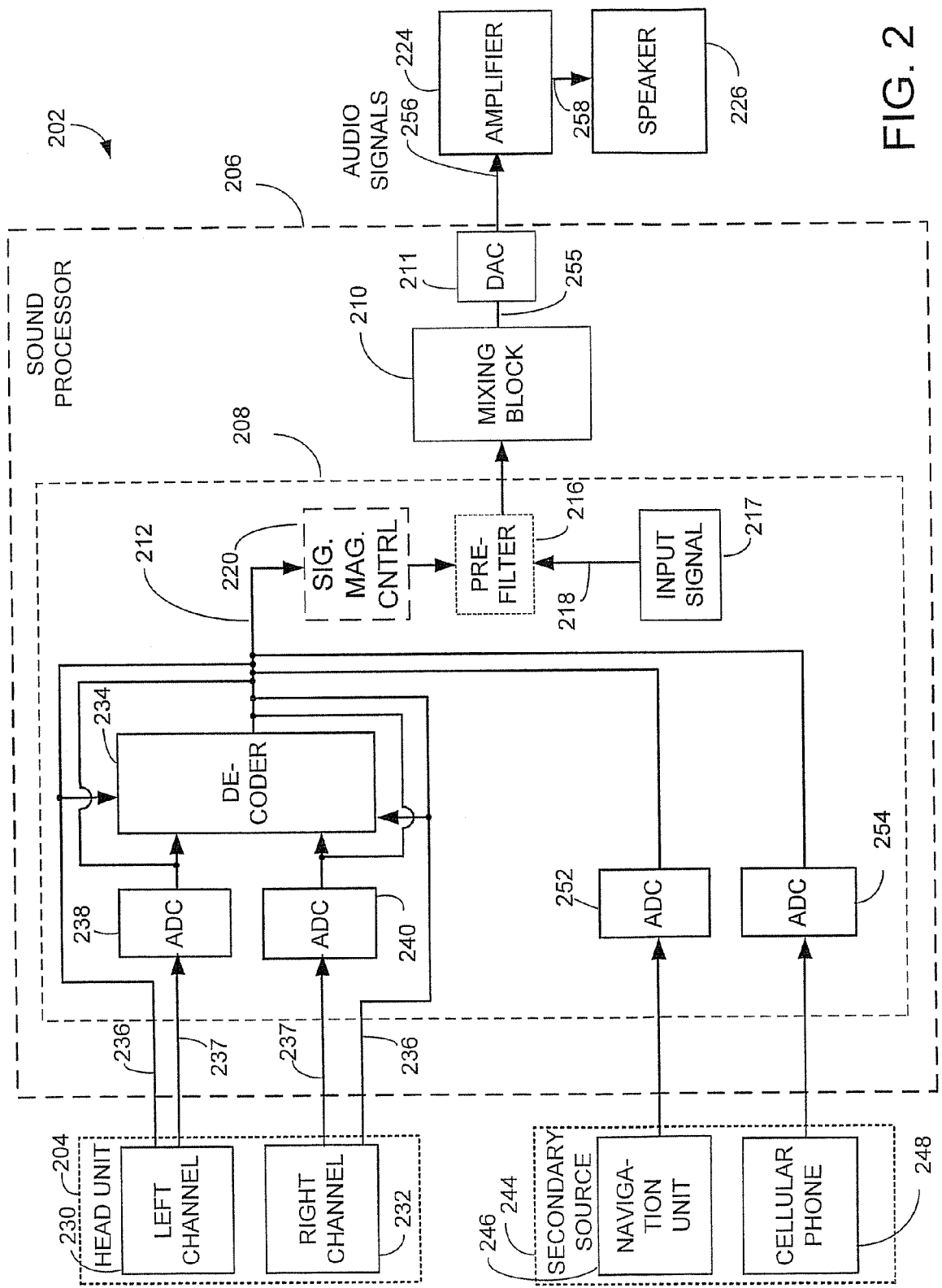
FIG. 2 is a block diagram or flow chart of a sound processing system.

FIG. 2 is an example block diagram or a flow chart of a sound processing system 202. In general, a head unit 204 provides at least one real audio input signal to a sound processor 206. The head unit 204 may include a radio, a digital player such as a CD, DVD, or SACD, or the like. The sound processor 206 includes a pre-processor block 208, a mixing block 210 and a digital-to-analog converter (DAC) 211. The sound processor 206 also includes a memory, such as RAM, ROM, FLASH, magnetic and/or any other form of memory device capable of storing data and instructions. The sound processor 206 may execute instructions stored in memory to perform the processing described.

In general, the real audio input signals may be converted into the digital domain, decoded and filtered by the pre-processing block 208 to produce distinct decoded signals. The pre-processed real audio input signals may be provided to a mixing block 210 on a mixing line 212 that is a plurality of real audio input channels. The digitally converted pre-processed real audio input signals may also be provided to the mixing block 210 on the mixing line 212 without decoding. The pre-processed real audio input signals may also be provided to the mixing block 210 on the mixing line 212 without digital conversion. The pre-processed real audio input signals may be filtered or unfiltered. The pre-processed real audio input signals supplied on the mixing line 212 (decoded, or not, digitally converted or not, filtered or not) may be mixed in various proportions by the mixing block 210. The proportions range from one or more of the pre-processed real audio input signals (digitally converted or not, filtered or not) to one or more of the decoded signals, including combinations of converted signals and decoded signals.

Within the pre-processing block 208, a pre-filter 216 may apply additional tone, loudness and/or crossover filtering to the real audio input signals provided on the mixing line 212. The filtration performed by pre-filter 216 may be in response to input signals from an input signal block 217 provided on an input signal line 218. Input signals may include: vehicle operational parameters such as a vehicle speed and engine revolutions-per-minute (RPM); sound settings such as tone level, bass level, and treble level from the head unit 204; input sound pressure level (SPL) from interior microphones 150-1, 150-2, and/or 150-3 (see FIG. 1); or some combination. In addition, vehicle input signals may include vehicle speed provided by a vehicle data bus (not shown). In another aspect, vehicle input signals may include vehicle state signals such as convertible top up, convertible top down, vehicle started, vehicle stopped, windows up, windows down, ambient vehicle noise (SPL) from interior microphone 150-1 (FIG. 1) placed near the listening position, door noise (SPL) from door microphone 150-2 (FIG. 1) placed in the interior of a door, and the like. Other input signals such as fade, balance, and global volume from the head unit 204, the navigation unit 246, the cellular phone 248, or a combination may also be used.

When the real audio input signals are fixed level inputs, zone control (fade control and balance control) and volume control may be performed with a signal magnitude control block 220. Alternatively, the signal magnitude control block 220 may include only the zone control, and the volume control may be performed in the mixing block 210. In still another alternative, the signal magnitude control block 220 may be entirely included in the mixing block 210 as discussed later.

Within the mixing block 210, sound processor 206 manipulates and/or decodes the pre-processed real audio input signals. The DAC 211 may convert the manipulated audio and/or decoded signals into the analog domain. The analog audio output(s) may be amplified with an amplifier 224 and routed to one or more speakers 226 such as the CTR speaker 124, LF speaker 113, RF speaker 115, LS speaker 117, RS speaker 119, LR speaker 129, and RR speaker 130 as discussed with respect to FIG. 1. While a particular configuration and operation is described, other configurations and operations may be used including those with fewer or additional components.

In operation, the example primary source head-unit 204 may generate real audio input signals on a left channel 230 and a right channel 232 that are fixed level inputs. The left and right audio input signals on the left and right channels 230 and 232 may be processed similarly or differently. If the real audio input signals on the left channel 230 and right channel 232 are digital, the audio signals pass directly to the pre-filter 216, a decoder 234, or the mixing block 210 on digital audio input lines 236. If the audio signals on left channel 230 and right channel 232 are analog, the audio signals are provided on analog audio input lines 237 and pass through one or more analog to digital converters (ADC) 238 and 240, and then pass to the pre-filter 216, the decoder 234, or the mixing block 210. The head unit 204 may also produce real audio input signals that are variable level inputs to the pre-processor block 208.

The pre-filter 216 may include one or more filters (not shown) that may provide conventional filter functions such as allpass, lowpass, highpass, bandpass, peak or notch, treble shelving, base shelving and/or other audio filter functions. In one aspect, left channel 230 and right channel 232 are input directly into mixing block 210. In another aspect, the left channel 230 and right channel 232 are input to decoder 234. In a further aspect, the left channel 230 and right channel 232 are input to pre-filter 216. Similarly, an optional secondary source 244 provides source signals from a navigation unit 246 and a cellular phone 248 to analog to digital converters (ADC) 252 and 254, respectively. These digital source signals are input into the mixing block 210 or pre-filter 216.

From the primary-source digital inputs, such as direct from ADC 238 and ADC 240 or indirect from pre-filter 216, the decoder 234 may generate multiple decoded signals that are output to mixing block 210 on the mixing line 212. In one aspect, there are five decoded signals. In another aspect, there are seven decoded signals. There may be other multiples of decoded signals including those for a subwoofer (not shown). The decoder 234 may decode digital inputs, such as DOLBY DIGITAL® or DTS® signals, into multi-channel outputs. The decoder 234 may also decode encoded 2-channel inputs, such as Dolby Pro Logic I®, Dolby Pro Logic II®, DTS Neos 6® signals, MP4+, digital stream, etc. into multi-channel outputs.

The decoder 234 may also apply other decoding methods, such as active matrix, to generate multi-channel outputs that are inputs to the mixing block 210. The digital inputs can result in 5.1 output—LF (left-front), CTR (center), RF (right-front), LR (left-rear), RR (right-rear), and LFE (low frequency). The digital inputs also can result in 6.2 output—LF, CTR, RF, LS (left-side), RS (right-side), LR, RR, left LFE, and right LFE. The digital inputs can also result in any other output configuration. Similarly, an active matrix processed 2-channel input can result in 4.0 output—LF, CTR, RF, and S (surround)). Other multi-channel outputs are also possible.

In addition to the audio and secondary source signals, the outputs from decoder 234 can be input on the mixing line 212 to the mixing block 210. In response, the mixing block 210 may generate audio output signals of the sound processor 206 on an output signal line 255. In one aspect, there are four or more audio signals on the output signal line 255. In other examples, there may be other multiples of audio signals on the output signal line 255. The audio signals on the output signal line 255 that are generated by the mixing block 210 are converted to the analog domain by the DAC 211 and input to the amplifier 224 on an amplified input signal line 256. Amplified outputs supplied by the amplifier 224 on an amplified outputs line 258 may drive one or more transducers, such as the speaker 226.

Figure 3:
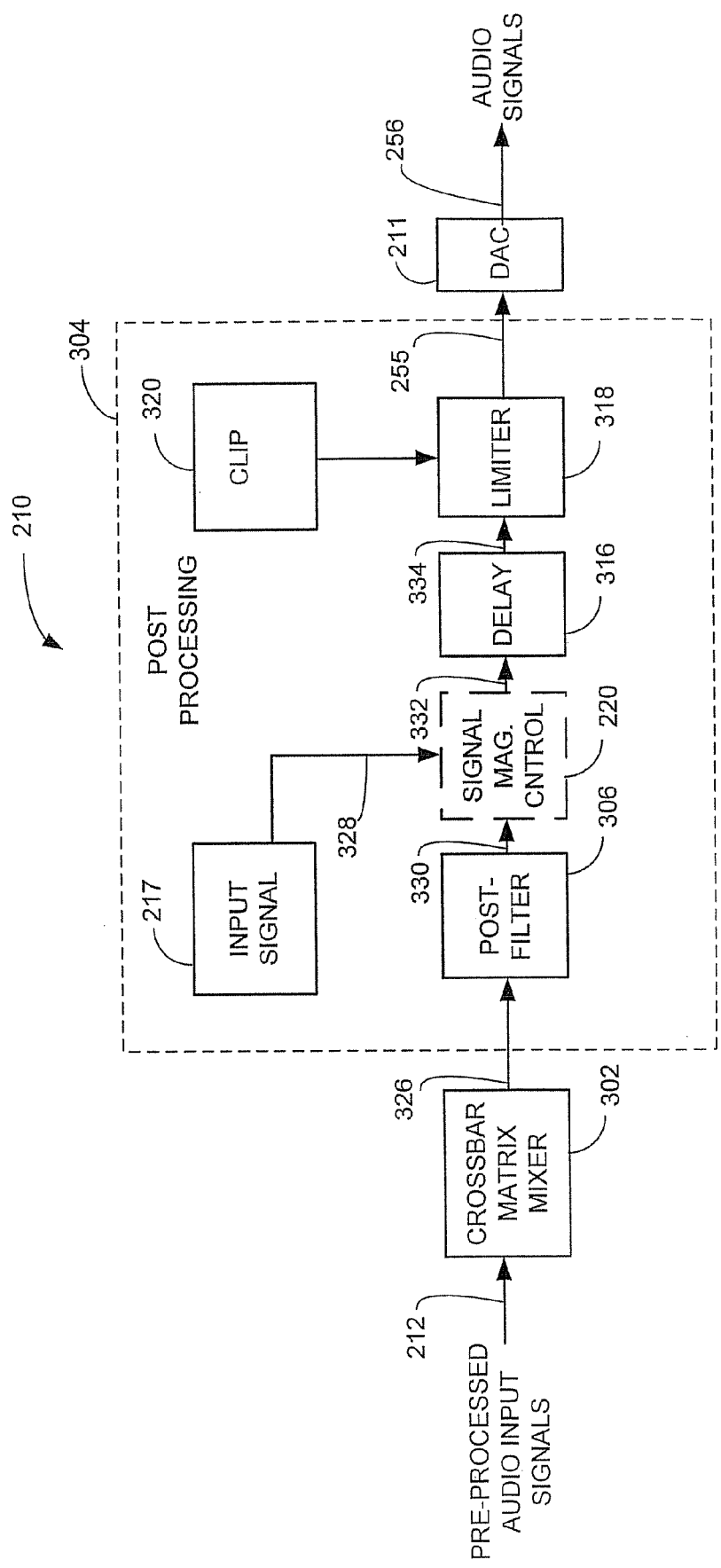
FIG. 3 is a block diagram of a portion of the sound processing system illustrated in FIG. 2.

FIG. 3 is a block diagram illustrating an example of the mixing block 210 illustrated in FIG. 2. The illustrated mixing block 210 includes a crossbar matrix mixer 302 and a post processing block 304. The post processing block 304 may include a post-filter block 306, a digital EQ block 308, the input signal block 217, the signal magnitude control block 220, a delay block 316, a limiter block 318 and a clip detect block 320. Also illustrated is the digital-to-analog (DAC) converter block 211. As previously discussed, real audio input signals from the head unit 204 (FIG. 2) and/or other optional secondary source(s) may be pre-processed such as pre-filtering, decoding, etc. The pre-processed real audio input signals may be provided on the mixing line 212. The mixing line 212 may be a plurality of real input channels providing pre-processed real audio input signals to the crossbar matrix mixer 302.

The crossbar matrix mixer 302 (or crossbar mixer) may mix the pre-processed real audio input signals to produce real audio output signals. Mixing with the crossbar matrix mixer 302 may include active mixing and/or modification of the real audio input signals using inter-channel coherence factors and active steering signal parameters. As a result, output channels 326 of the crossbar matrix mixer 302 may provide equalization and/or various complex sound effects by processing the real audio input signals.

The output channels 326 of the crossbar matrix mixer 302 include real audio output channels carrying real audio output signals. The real audio output signals may be further processed in the post processing block 304 to produce audio signals used to drive individual speakers 226 (FIG. 2). In addition, the output channels 326 may include one or more virtual output channels carrying virtual output signals. The virtual output signals are formed by the crossbar matrix mixer 302 by mixing the real audio input signals provided on the mixing line 212. The virtual output signal may also be processed by the post processing block 304. Any number of real audio input signals may be used by the crossbar matrix mixer 302 to mix the signals present on the output channels 326.

Real audio output signals on the output channels 326 that have been mixed by the crossbar matrix mixer 302 are input to post-filter 306. Post-filter 306 may be configured to include one or more digital filters (not shown) that provide conventional filter functions such as allpass, lowpass, highpass, bandpass, peak or notch, treble shelving, base shelving, other audio filter functions, or a combination.

The post-filter 306 may be a multi-channel post filter having one or more filter output channels 330 corresponding to each of the output channels 326 received from the crossbar matrix mixer 302.

Filtered audio signals are output on the filter output channels 330 that are connected to the signal magnitude control block 220. The signal magnitude control block 220 may include a volume gain, balance and/or fade control. The volume gain may apply global volume attenuation to all audio signals output by the post filter 306, or localized attenuation to the signals present on specific channels. The gain of the volume gain may be determined manually or by vehicle input signals from the input signal block 217 that are indicative of vehicle operation parameters, as previously discussed.

The balance and fade control is a zone control. The zone control is adjustable to control the magnitude (or signal strength) of the audio signals processed by the sound processor 206. Adjustment with the zone control affects the sound produced with the audio signals in each of a plurality of sound zones. The sound zones may correspond to one or more loudspeakers in a vehicle. For example, where LF, RF, LR and RR 113, 115, 129 and 130 loudspeakers as illustrated in FIG. 1 represent the sound zones in a vehicle, the fade control can be adjusted to attenuate the audio signal driving either the front (LF and RF) or the rear pair of loudspeakers (LR and RR). The balance control may attenuate the audio signals driving the LF and LR, or the RF and RR loudspeakers. Accordingly, using the balance and/or fade control, the sound produced in the sound zones in a vehicle may be minimized and/or maximized by adjustment of the signal strength of the audio signals driving the respective loudspeakers.

The signal magnitude control block 220 outputs audio signals on a signal output line 332 to the delay block 316. The delay block 316 is configurable to implement various delays of the audio signals. Delays may be implemented, for example, to realize surround sound or any other desired effects. The delays may be applied uniformly to all the audio signals. Alternatively, the delays may be individually set for groups and/or individual audio signals. The delayed audio signals may be supplied to the limiter 318 on a delay output line 334. An output of the limiter 271 is provided on the output signal line 255 as an input to the DAC 211. The limiter 318 may employ clip detection using a clip detect block 320. An analog audio output signal from the DAC 211 is provided on the amplifier input signal line 256 as previously discussed with reference to FIG. 2 to drive a loudspeaker.

Figure 4:
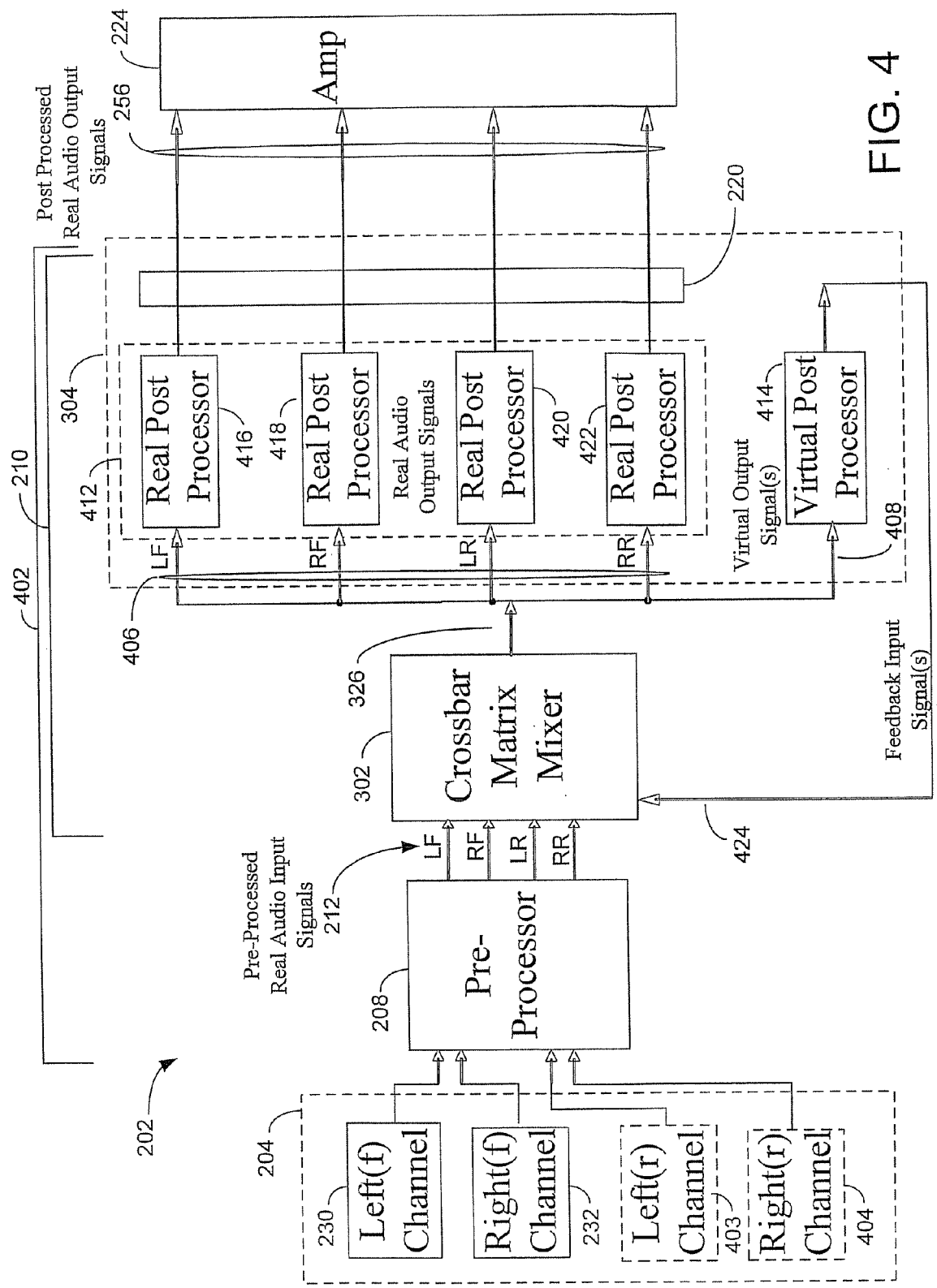
FIG. 4 is a block diagram of a sound processing system illustrating aspects of the mixing block illustrated in FIG. 2.

FIG. 4 is a block diagram generally illustrating creation of a virtual output channel using the sound processing system 202. The sound processing system 202 includes the head unit 204 and/or other optional secondary sources as previously discussed and a sound processor 402. The sound processor 402 includes the pre-processor block 208 and the mixing block 210. The real audio input signals from the head unit 204, such as the left and right audio input signals on the left and right channels 230 and 232, may be pre-processed in the pre-processor block 208 to produce a plurality of pre-processed real audio input signals on the mixing line 212. Alternatively, the head unit 204 (or some other source) may produce four or more real audio input signals, such as on four real audio input channels 230, 232, 403 and 404 (Left$_{(f)}$, Right$_{(f)}$, Left$_{(r)}$, Right$_{(r)}$). Pre-processing by the pre-processor block 208, such as filtering, decoding, etc. as previously discussed, may occur prior to the pre-processed real audio input signals being provided to the mixing block 210 on the mixing line 212.

Within the mixing block 210, the crossbar matrix mixer 302 may produce mixed audio signals on some of the output channels 326. The mixed audio signals are real audio output signals that are mixed by the crossbar matrix mixer 302 based on the real audio input signals. In the illustrated example, four real audio output signals, identified as an LF signal, an RF signal, an RR signal and an LR signal are mixed and provided on respective real audio output channels 406. In other examples, any other number of real audio output signals may be produced by the crossbar matrix mixer 302 on any number of real audio output channels 406.

The real audio output signals on the real audio output channels 406 may be used to drive the speakers 226 (FIG. 2) such as the LF speaker 113, RF speaker 115, LR speaker 129, and RR speaker 130, illustrated in FIG. 1. In addition, the crossbar matrix mixer 302 may produce virtual output signals on a portion of the output channels 326. The portion of the output channels 326 carrying virtual output signals are virtual output channels 408. The virtual output channel 408 is defined as a processed channel providing a virtual output signal formed from mixing at least one real audio input signal from the head unit 204 (or some other source). Although only one virtual output signal and virtual output channel 408 are illustrated, the crossbar matrix mixer 302 may be configured to mix any number of virtual output signals on any number of virtual channels 408.

Signals on the real audio output channels 406 and the virtual output channel 408 may be post processed by the previously discussed post processing block 304. Specifically, the real audio output signals may be post processed with real post processor blocks 412 and the virtual output signal(s) may be post processed with a virtual post processor block(s) 414. In the illustrated example, a first real post-processor block 416 processes the LF signal, a second real post-processor block 418 processes the RF signal, a third real post-processor block 420 processes the LR signal, and a fourth real post-processor block 422 processes the RR signal.

Following post-processing with the real post processor blocks 412, the real audio output signals may be processed through the signal magnitude control block 220. As previously discussed, the signal magnitude control block 220 may control the balance, fade and volume of the real audio output signals. After the signal magnitude control block 220, the post processed real audio output signals may be provided as audio signals on the amplifier input signal line 256 to the amplifier 284 as previously discussed with reference to FIG. 2.

The virtual output signal on the virtual output channel 408 may be routed back into the crossbar matrix mixer 302 following post processing. Note that in this example configuration, the virtual output signal is not routed through the signal magnitude control block 220. The post-processed virtual output signal may be provided as a feedback input signal on a feedback channel 424. The feedback channel 424 is an input channel that provides the feedback input signal as an input to the crossbar matrix mixer 302 similar to the pre-processed real audio input signals provided on the mixing line 212. Within the crossbar matrix mixer 302, the feedback input signal provided on the feedback channel 424 may be mixed with one or more of the pre-processed real audio input signals to form one or more of the real audio output signals on the real audio output channels 406.

In operation, the crossbar matrix mixer 302 may mix one or more of the pre-processed real audio input signals to create the virtual output signal on the virtual output channel 408. For example, one or more of the real audio input signals may be mixed similar to the mixing performed to create one of the real audio output signals to form the virtual output signal. Alternatively, a plurality of real audio input signals may be mixed together by the crossbar matrix mixer 302 to form the virtual output signal. The virtual output signal may be post processed with the virtual post processor 414 to form a desired feedback input signal on the feedback channel 424. For example, the virtual output signal may be filtered by the virtual post processor block 414 to obtain a predetermined frequency range of audio signals that form the feedback input signal.

The feedback input signal may be received as an input by the crossbar matrix mixer 302 and mixed with the pre-processed real audio input signals to form the real audio output signals on the real output channels 406. The feedback input signal may be one sample delayed with respect to the pre-processed real audio input signals. The frequency range of the feedback input signal may be a subset of the frequency range of the real audio input signals due to the post processing of the virtual output signal. Accordingly, the frequency range of the feedback input signal may not be equal to the frequency range of the real audio input signals and may cover only a portion of the frequency range of the real audio input signals.

One example application using the feedback input signal formed with a predetermined frequency range of the pre-processed real audio input signal(s) is within a bass summing application. In this example, the predetermined frequency range resulting from filtering of the real audio input signals may be a low frequency range such as 0 to 50 Hz, 0 to 100 Hz, or 20 to 100 Hz. The feedback input signal may be mixed with those real audio input signals that are mixed to drive a low frequency transducer, such as a woofer. For example, a first real audio input signal may be mixed and then filtered to form the feedback input signal (the virtual output signal) with a predetermined frequency range. The same first real audio input signal may also be similarly mixed to form a first real audio output signal. A second real audio input signal may be mixed with the feedback input signal to form a second real audio output signal. Thus, a predetermined frequency range of the first real audio signal is included in the second real audio output signal.

The feedback input signal may be mixed to include any combination of the real audio input signals. As described later, if one or more of the real audio input signals are attenuated or minimized, the feedback signal mixed from the real audio input signals would reflect the attenuation. As such, a first real audio output signal mixed from the same attenuated real audio input signal(s), and the feedback input signal will still include a predetermined frequency range of one or more of the non-attenuated real audio input signals provided via the feedback input signal. Other real audio output signals mixed from the non-attenuated real audio input signals would not be attenuated. Accordingly, the first real audio output signal would include a predetermined frequency range of one or more of the other real audio output signals.

Figure 5:
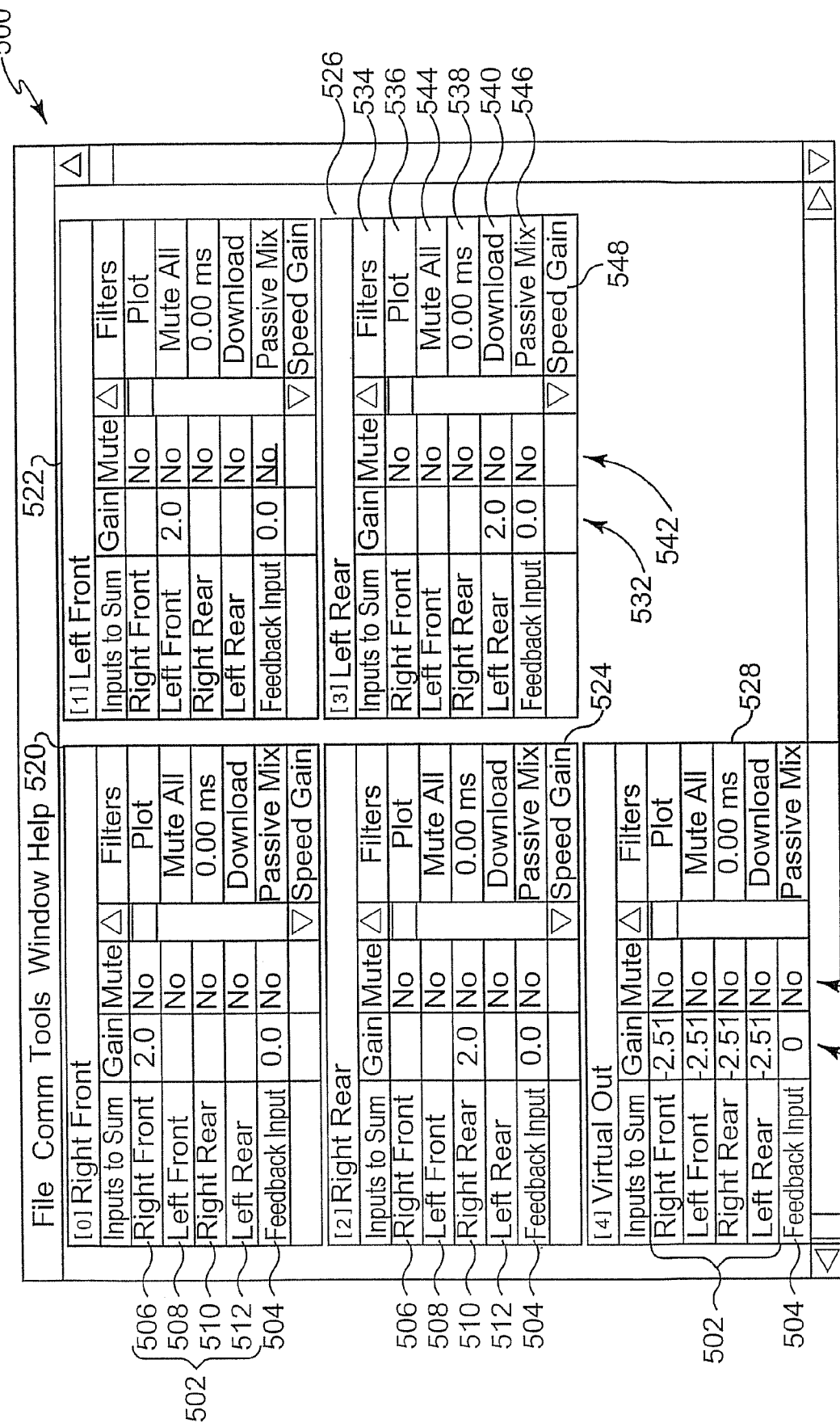
FIG. 5 is a table illustrating a configuration of a crossbar matrix mixer illustrated in FIGS. 3 and 4.

FIG. 5 is a table 500 depicting an example configuration to mix a plurality of pre-processed real audio input signals 502 with the crossbar matrix mixer 302. The real audio input signals 502 are provided on the real audio input channels of the mixing line 212 (FIG. 4), as previously discussed. In addition, the example configuration includes a feedback input signal 504 provided to the crossbar matrix mixer 302 on the feedback channel 424 (FIG. 4). In the illustrate example there are four real audio input signals 502 (Inputs to Sum) that may be pre-processed by the pre-processor block 208 (FIG. 4). The real audio input signals 502 of the illustrated example include a first real audio input signal 506, a second real audio input signal 508, a third real audio input signal 510 and a fourth real audio input signal 512, identified as a right front (RF), a left front (LF), a right rear (RR) and a left rear (LR) signal, respectively. In other examples, fewer or additional input signals may be included.

There are also four real audio output signals provided on four real audio output channels 406 (FIG. 4) and one virtual output signal provided on the virtual output channel 408 (FIG. 4) represented in the example cross bar matrix mixer 302 (FIG. 4) configuration. The real audio output signals are represented by output channel configurations that include a right front output channel configuration 520, a left front output channel configuration 522, a right rear output channel configuration 524 and a left rear output channel configuration 526 of the crossbar matrix mixer 302 (FIG. 4).

The output channel configurations may each be individually configured to define the mix of the real audio input signals 502 and/or the feedback input signal 504 that produces a respective real audio output signal on a respective real audio output channel 406 (FIG. 4). The configuration that defines the virtual output signal on the virtual channel 408 (FIG. 4) is represented with a virtual output channel configuration 528. The virtual output channel configuration 528 defines the feedback input signal 504 on the feedback channel 424 (FIG. 4) from any combination of one or more of the real audio input signals 502 and/or other feedback input signals 504.

The output channel configurations 520, 522, 524, 526 and 528 allow a gain to be configured for each of the input signals 502 and 504 within the crossbar matrix mixer 302 (FIG. 4). For example, the left rear output channel configuration 526 corresponds to the left rear real audio output signal (LR) on the left rear output channel. A gain setting selection 532 allows the gain of each of the input signals 502 and 504 to be selected for the left rear output channel. If the gain setting selection 532 is left blank, a determined default gain may be used, such as −100 dB. In the example illustrated in FIG. 5, the left rear output channel configuration 526 has a gain of 2.0 for the left rear real audio input signal 512 and a gain of 0.0 for the feedback input signal 504. In other examples, any other gains of the input signals 502 and 504 may be determined and configured to form signals on the real audio output channels 406 and the virtual output channel 408 (FIG. 4).

Each of the output channel configurations may also provide for the configuration of post processing filter configuration(s) of the post filter block 306 (FIG. 3) using a filter selection 534. The filtered response of the signal on the respective channel may be plotted with a plot selection 536. In addition, the delay block 316 (FIG. 3) may be configured using a delay selection 538. The configuration may also be downloaded from a configuration computer (not shown) into the sound processor using the download selection 540. The real audio input signal(s) being mixed to form the real audio output signal for a particular output channel 326 (FIG. 4) may also be individual muted with an individual mute selection 542. Alternatively, all of the input signals may be muted with a mute all selection 544. A passive mix selection 546 may also be selectable to mix the input signals using a passive matrix to manually sum two or more of the input signals using ratios to drive one or more output signals.

The real audio output channel configurations 520, 522, 524 and 526 may also have the capability to provide a speed gain compensation function using a speed gain selection 548. The speed gain compensation function may compensate for the speed of the vehicle. For example, one or more of the gains may be dynamically increased base on the speed gain selection 548 as the speed of the vehicle increases. The gains may be dynamically increased to compensate for road noise, wind noise, etc.

In the illustrated example, the feedback input signal (the processed virtual output signal) is formed with the virtual output channel configuration 528 by setting the gain setting selection 532 with a gain of −2.51 for each of the real audio input signals 502. It is to be noted that where more than one feedback input signal 504 is present, a determined gain may also be set in the gain setting selection 532 for the feedback input signal 504 developed from another virtual output signal. The virtual output signal may be processed in the virtual post processor block 414 (FIG. 4) to form the feedback input signal as previously discussed. In this example, the virtual channel configuration 528 may be further configured with filters selected via the filter selection 534 to be implemented as part of the post processing. In a bass summing application where a predetermined low frequency range is desired, the selected filters may include a fourth order high-pass filter with a center frequency at about 20 Hertz and an eighth order low-pass filter with a center frequency at about 100 Hertz.

As previously discussed, the example virtual output channel configuration 528 may provide a predetermined frequency range of the feedback input signal 504. In the example depicted in FIG. 5 the feedback input signal 504 on the feedback channel 424 provides bass summing by combining the bass signal portion of each of the real audio input signals 502 to form the feedback input signal 504 on the feedback channel 424 (FIG. 4). Each of the real audio input signals 502 may be mixed with the summed bass signal portions of the real audio input signals 502. For example, the right front output channel configuration 520 includes the right front audio input signal 506 with a gain of 2.0, and the feedback input signal 504 with a gain of 0.0.

In the illustrated example, each of the real audio input signals 502 are mixed with the feedback input signal 504 to form a corresponding audio signal. For example, the left and right front real audio input signals 506 and 508 are each mixed with the feedback input signal 504 at predetermined gains to form the respective right and left front audio signals. Thus, the right front audio signal includes a predetermined frequency range of the left front audio signal due the feedback input signal 504. In fact, all of the real audio signals available to drive loudspeakers in the example illustrated in FIG. 5 include a predetermined frequency range of the other audio signals due to the feedback input signal 504.

Referring again to FIGS. 4 and 5, an example bass summing application is further described. As previously discussed, global volume control of the audio output channels 306 may be performed in the signal processing of the post processing block 304 for the audio output channels 406. The global volume may be attenuated with the post processing block 304 when, for example, the real audio input signals 502 to the crossbar matrix mixer 302 (FIG. 4) are fixed inputs. More specifically, the signal magnitude control block 220 may attenuate the real audio output signals on the amplifier input signal lines 256. Accordingly, as the volume is increased, the attenuation of only the real audio output signals on the real audio outputs channels 406 may be reduced. Similarly, fade and balance control of the real audio output channels 406 using the zone control portion of the signal magnitude control block 220 may be performed with the channel processing in the post processing block 304. Other processing, such as filtering, vehicle operational parameter adjustments, etc., as previously discussed, may also be performed on the real audio output signals on the real audio output channels 406 in the real post processing blocks 412.

The virtual output signal may be processed through the virtual post processing block 414 to perform filtering, vehicle operational parameter adjustments, etc. to form the feedback input signal 504 on the feedback channel 424. The feedback input signal 504, however, is not subject to the possibility of attenuation by the signal magnitude control block 220. The feedback input signal 504 is not subject to attenuation since the feedback input signal 504 is fed into the crossbar matrix mixer 302 as an input signal instead of being processed through the signal magnitude control block 220. Accordingly, the real audio input signals 502, or portions thereof that form the feedback input signal 504 are not attenuated or otherwise signal strength adjusted when the signal magnitude control block 220 is adjusted to modify the signal strength of the output signals on the amplifier input signal lines 256.

In applications using the feedback input signal 504 for a bass summing application, the feedback input signal 504 includes the sum of one or more of the post processed (filtered) real audio input signals 502 without attenuation by the signal magnitude control block 220. However, the real audio output signals formed by mixing the real audio input signals 502 with the feedback input signal 504 may be attenuated by the signal magnitude control block 220. Accordingly, bass summing may be included on one or more of the real audio output channels 406 and attenuated with the signal magnitude control block 220.

Referring still to FIGS. 4 and 5 in another example, the crossbar matrix mixer 302 may be used with variable level inputs from the head unit 204 (our other source). In this configuration, an example bass summing application may be implemented when the zone control (balance and fade control) is performed within the signal magnitude control block 220 of the pre-processor block 208 and only the global volume control is in the signal magnitude control block 220 of the post processing block 304.

For purposes of example, the LF speaker 113 and the RF speaker 115 of FIG. 1 may be mid and high frequency response transducers (midrange and tweeter). The LF speaker 113 and the RF speaker 115 (FIG. 1) may be driven by audio signals from the real audio output channels 406 that are mixed by the crossbar matrix mixer 302 based on the configuration of the left front output channel configuration 522 and the right front output channel configuration 520, respectively. The LR speaker 129 and RR speaker 130 of FIG. 1 may be low frequency response transducers (woofers) driven by audio signals from real audio output channels 406 that are mixed based on the configuration of the left rear output channel configuration 526 and the right rear output channel configuration 528, respectively. In other examples, the summing configuration of the crossbar matrix mixer 302 may also include formation of audio signals from additional real audio output channels 406 that are mixed to drive other loudspeakers such as LS speaker 117, RS speaker 119, CTR speaker 124, etc. (FIG. 1).

During operation with reference to FIGS. 2, 3, 4 and 5, the balance and/or fade control may be adjusted with the signal magnitude control block 220 within the pre-processor block 204 to attenuate the right rear real audio input signal 510 and the left rear real audio input signal 512 to zero. In the example configuration of FIG. 5, at this time, the pre-processed real audio input signals corresponding to the left front and right front real audio input signals 506 and 508 may continue to provide input signals to the crossbar matrix mixer 302. As such, the virtual output signal on the virtual output channel 408 will continue to provide the feedback input signal 504 on the feedback channel 424.

Based on the mix of the example virtual channel configuration 528 of FIG. 5, the feedback input signal 504 will include the bass component of the sum of the right and left front real input signals 506 and 508. Only the bass component of the sum of the right and left front real input signals 504 and 506 are included since the pre-processed real audio input signals 510 and 512 are attenuated to zero. Accordingly, the bass component is a predetermined frequency range of the combination of the light and left front real input signals.

In other examples, the front real input signals 506 and 508 may be attenuated and the rear real input signals 510 and 512 may continue to be provided. In still other examples involving attenuation with a balance control, the attenuated real input signal may be the left real input signal 506 and the right real input signal 504 may continue to be provided. Accordingly, the bass summing component may be a right bass summing component and a left bass summing component each of a predetermined range of frequency driving the respective right and left loudspeakers even when one of the respective right and left real input signals 504 and 506 are attenuated.

Since, the feedback input signal 504 is mixed into the real audio output signals on the real audio output channels 406 based on the light and left rear output channel configurations 524 and 526, the left and right rear real audio output signals provided by the crossbar matrix mixer 302 may include only the feedback input signal 504. Thus, the feedback input signal 504 may be the audio signal available to drive the LR speaker 129 and the RR speaker 130 (FIG. 1) to produce low frequency audio output even when the real audio output signals based on the right rear and left rear real input channels 508 and 510 have been faded and/or have been balance controlled to be zero. In this condition, the LF speaker 113 and RF speaker 115 may be driven by respective audio signals to produce the high and mid range audio sound while low range audio sound may still be produced from the LR speaker 129 and the RR speaker 130 (FIG. 1). Accordingly, LR speaker 129 and the RR speaker 130 are driven by a predetermined frequency range of the audio signals currently driving the LF speaker 113 and RF speaker 115. It should be recognized that operation will be similar when the real audio output signals are attenuated to some magnitude greater than zero. In other examples, balance control related attenuation, or the combination of balance and fade control related attenuation may also produce similar operation.

Figure 6:
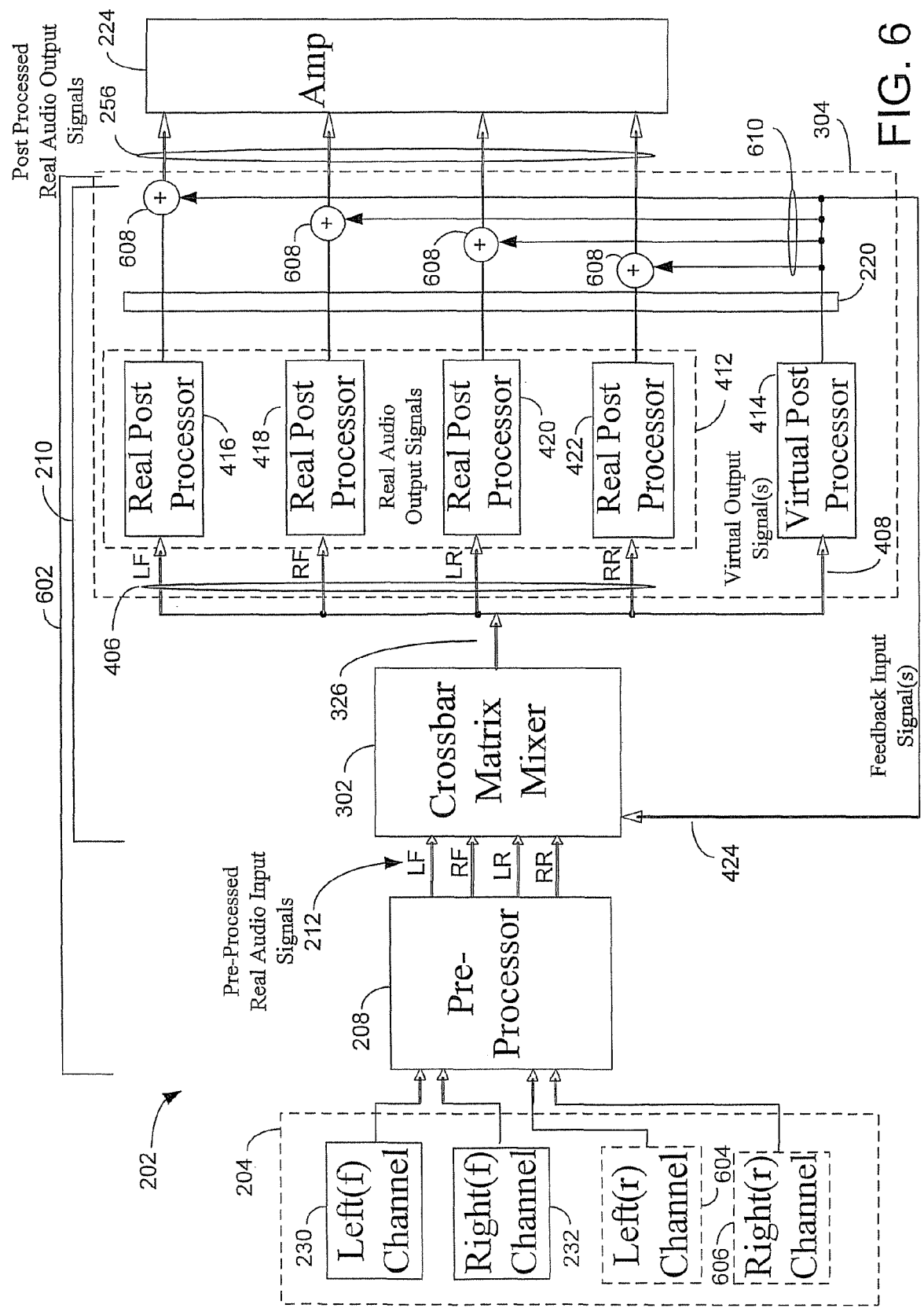
FIG. 6 is a block diagram of a sound processing system illustrating aspects of the mixing block illustrated in FIG. 2.

FIG. 6 is another example implementation of a bass summing functionality. The illustrated sound processing system 202 includes the head unit 204 (or other previously discussed source), the pre-processor 208, the crossbar matrix mixer 302 and the post processing block 304. The head unit 204 may provide a fixed input left and right real audio input signal on the left channel 230 and the right channel 232, respectively. Alternatively, the head unit 204 may provide a variable input with four our more real audio input signals, such as, $L_f$, $R_f$, $L_r$, and $R_r$ channels 230, 232, 604 and 606. In another alternative other real audio signal sources may provide the real audio input signals.

The sound processor 602 may include the pre-processor block 208 and the mixing block 210. The mixing block 210 may include the crossbar matrix mixer 302 and the post processing block 304. The post processing block 304 may include the real post processor blocks 412 and the virtual post processor block(s) 414. In addition, the signal magnitude control block 220 may be used to control volume, balance and fade. In this example, however, the signal magnitude control block 220 may control attenuation of the post processed real audio output signals. In addition, the signal magnitude control block 220 may control the feedback input signal (post processed virtual output signal).

The post processing block 304 also includes a plurality of summers 608. The summers 608 may be at the output side of the signal magnitude control block 220. A separate summer 608 may be provided on each of the audio output signals (LF, RF, LR, RR), as illustrated. The output of the summers 608 may be audio signals supplied on respective amplifier input signal lines 256. The audio signals are post processed real audio output signals that are available to drive speakers 226 (FIG. 2), as previously discussed. One input to each of the summers 608 may be the respective audio signals provided from the real post processor 412 via the signal magnitude control block 220. Another input to each of the summers 608 may be the post processed virtual output signal(s) provided from the virtual post processor block(s) 414 via the signal magnitude control block 220 on a feed forward line 610.

The post processed virtual output signal(s) may be combined with the post processed real audio output signals by the summers 608 to provide a bass summing function. In this configuration, the virtual output signal(s) is formed by mixing one or more of the real audio input signals within the crossbar matrix mixer 302. The mixed one or more real audio input signals may be processed with the virtual post processor block 414. In the example bass summing application the mixed one or more real audio input signals may be filtered during post processing to obtain a predetermined low frequency portion of one or more of the audio signals available to drive loudspeakers. The real audio output signals are also mixed by the crossbar matrix mixer 302 and post processed by respective real post processor blocks 416, 418, 420 and 422.

The post processed virtual output signal and the post processed real audio output signals are then subject to the signal magnitude control block 220. The signal magnitude control block 220 of this configuration may be configured with separate volume control and zone control for the post processed virtual output signal(s) and the post processed real audio signals. For example, the volume control and zone control may attenuate the post processed virtual output signal(s) and the post processed real audio output signals the same. Alternatively, volume control attenuation may be the same, while only the post processed real audio output signals are subject to the zone control. In another alternative, volume control and zone control may be separate and independent for the post processed virtual output signal(s) and the post processed real audio output signals.

During operation when both the post processed virtual output signal and the post processed real audio output signals are volume and zone controlled together, attenuation of post processed virtual output signal(s) and the post processed real audio signals will be the same. Accordingly, speakers 226 such as, an LF, RF, LR and RR speaker, may be driven by the combination of a post processed virtual output signal combined with a respective post processed real audio output signal that is similarly attenuated. However, when the post processed virtual output signal and the post processed real audio output signals are not volume and zone controlled together, the post processed virtual output signal may be attenuated differently than the post processed real audio output signals.

For example, with the configuration illustrated in FIG. 5, where a LF and RF speaker 226 are mid or high range transducers (midranges or tweeters), and LR and RR speakers 226 are low range transducers (woofers), bass summing may be performed. In this example, the post processed virtual output signal may continue to drive speakers 226 when the post processed real audio output signals have been attenuated. During operation, when the zone control has attenuated some of the real audio output signals to zero, such as those forming the audio signals driving the LR and RR speakers 226, the respective summers 608 combine the post processed virtual output signal such that the LR and RR speakers 226 are driven by only the post processed virtual output signals. In other words, if the zone control is operated to fade the LR and RR speakers 226 to zero output, the LR and RR speakers 226 will continue to be driven by the post processed virtual output channel to output low frequency audio sound. As previously discussed, the same real audio input signals are used to form the virtual and real audio output signals. Thus, the LR and RR speakers 226 are driven by a predetermined frequency range of at least one of the non-attenuated post processed real audio output signals via the post processed virtual output signal.

In this example, the post processed virtual output signal is not attenuated or otherwise affected by operation of the signal magnitude control block 220 with respect to the post processed real audio output signals. Similarly, the real audio output signals are not attenuated or otherwise affected by operation of the signal magnitude control block 220 with respect to the post processed virtual output signal. As in the previous examples, although only a single virtual output signal is illustrated, any number of virtual output signals may be mixed by the crossbar matrix mixer 302 and summed with the real audio output signals to form the audio signals available to drive loudspeakers. Alternatively, the feedback input signal may be combined with the real audio output signals by the crossbar matrix mixer 302, as previously discussed, to perform bass summing.

Referring still to FIG. 6, in another example, a real audio input signal may be mixed by the crossbar matrix mixer 302 to generate an audio signal to drive a loudspeaker having a plurality of transducers. The crossbar matrix mixer 302 may mix the real audio input signal to create at least one real audio output signal and at least one virtual output signal. The real audio output signal and the virtual output signal may be independently processed by the real post processor block 412 and the virtual post processor block 414, respectfully. Filtering within the real post processor block 412 may be implemented to filter the real audio output signal to a first predetermined frequency range. The first predetermined frequency range may be a frequency response of a transducer, such as a tweeter, included in the loudspeaker. Filtering within the virtual post processor block 414 may be implemented to filter the virtual output signal to a second predetermined frequency range. The second predetermined frequency range may be a frequency response of a second transducer in the loudspeaker, such as a midrange.

The first predetermined frequency range is a different range of frequency than the second predetermined frequency range. For example, a typical frequency range of a woofer transducer is 20 Hz to 200-250 Hz, a typical frequency range of a midrange transducer is 200-250 Hz to 3000-5000 Hz, and a typical frequency range of a tweeter transducer is 3000-5000 Hz to 20 kHz. In other examples, any number of different predetermined frequency ranges could be used to generate an audio signal to drive a loudspeaker.

Filtering within the real post processor block 412 and the virtual post processor block 414 may also be implemented to independently delay the real audio output signal and the virtual output signal. The real audio output signal may be delayed by a first predetermined time delay and the virtual output signal may be delayed by a second predetermined time delay that is different than the first predetermined time delay. By independently delaying the real audio output signal and the virtual output signal, separate and independent phase control may be performed in the first and second predetermined frequency ranges.

The independently filtered and delayed real audio output signal and virtual output signal may be provided through the signal magnitude control block 220 to the summer 608. At the summer 608, the real audio output signal and the virtual output signal may be combined to form an audio signal. The audio signal may be a single audio signal on a single audio channel that can be made available to drive a single loudspeaker. More specifically, the post processed real audio output signal portion of the audio signal may drive a first transducer included in the loudspeaker, such as a tweeter. The post processed virtual output signal portion of the audio signal may drive a second transducer included in the loudspeaker, such as a woofer.

Accordingly, a single audio signal output on an audio channel can drive a number of transducers in a loudspeaker with passive crossover. A low pass portion of the audio signal and a high pass portion of the audio signal may each have different delays. Using filtering within the real post processor block 412 and the virtual post processor block 414, any desired phase delay between frequency bands of an audio signal may be achieved. Separately adjustable frequency dependent phase delay can also provide finer control of the delay of different frequency bands in an audio signal than would otherwise be possible. Accordingly, the delay between frequency bandwidths of an audio signal may be adjusted with greater sensitivity. For example, instead of being limited to 20 microsecond increments of delay that is typical of a filter, finer delay may be achieved. Thus, for example, a high frequency portion of an audio signal may be subject to finer delay, such as 5 microseconds.

Figure 7:
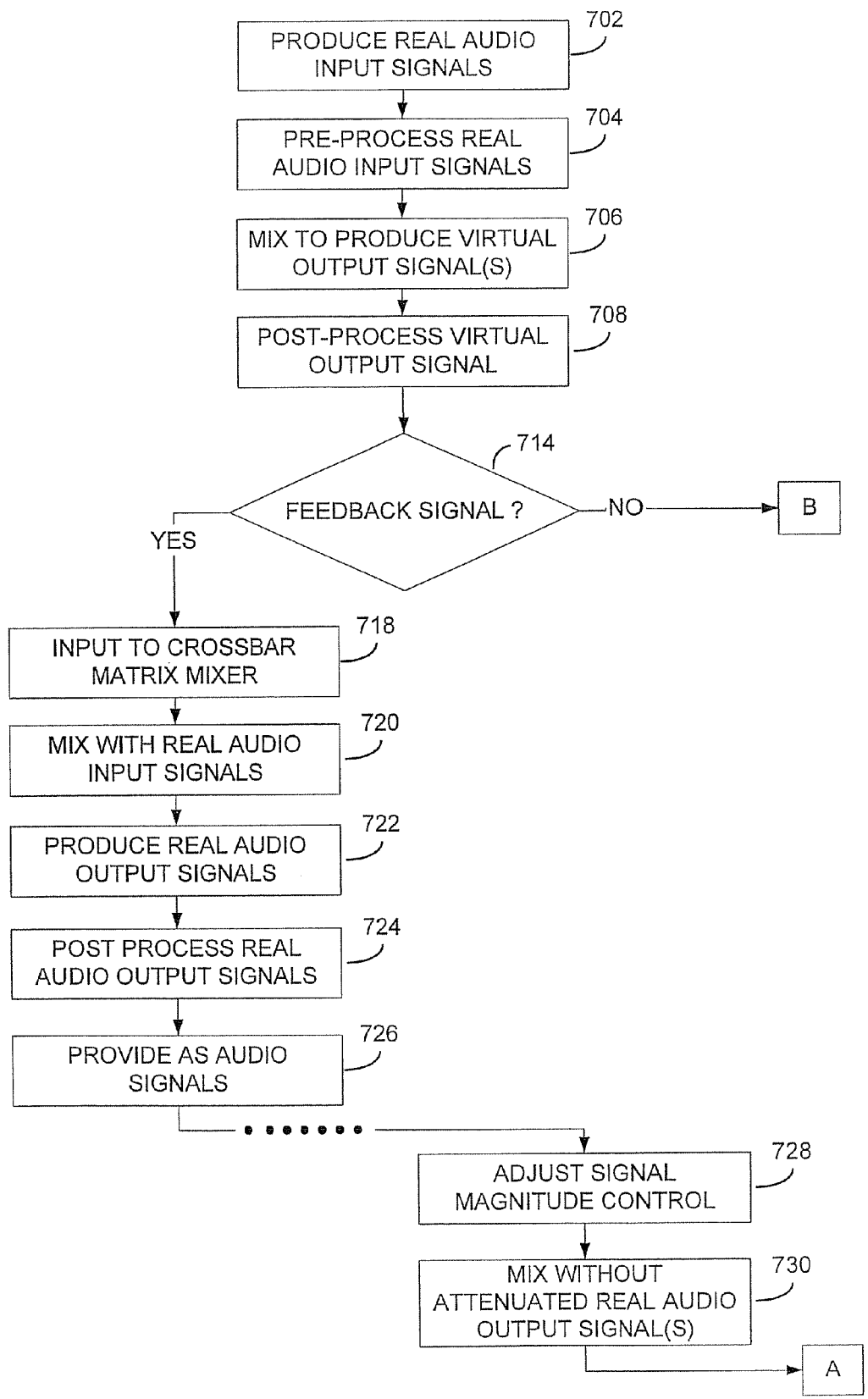
FIG. 7 is a flow chart of a method for performing bass summing with the sound processing system illustrated in FIGS. 2-6.

FIG. 7 is a process flow diagram illustrating operation of bass summing within the sound processing system with reference to FIGS. 1-6. At block 702, real audio input signals, such as a first and second audio input signals 506 and 508 (RF and LF) are produced by the head unit 204 or some other source of real audio input signals. The real audio input signals 506 and 508 are received and pre-processed by the pre-processor block 208 at block 704. At block 706, the pre-processed real audio input signals 506 and 508 are received by the mixing block 210 and mixed by the crossbar matrix mixer 302 to produce at least one virtual output signal. The virtual output signal may be mixed by combining the pre-processed first and second input signals 506 and 508 using respective predetermined gains. Alternatively, one of the first and second input signals 506 and 508 may be mixed with a respective predetermined gain to produce the virtual output signal(s).

At block 708, the virtual output signal is post processed with the virtual post processor block 414. Post processing may include filtering the virtual output signal with one or more a filters selected with the filter selection 534 to obtain a predetermined frequency range. It is determined if the post processed virtual output signal is provided as the feedback input signal 504 to the crossbar matrix mixer 302 at block 714. If the post processed virtual output signal is provided on the feedback channel 424, the feedback input signal 504 is received by the crossbar matrix mixer 302 at block 718. At block 720, the feedback input signal 504 is mixed using predetermined respective gains with one or more of the real audio input signals 502, such as with the second real audio input signal 508. If the feedback input signal 504 has been filtered to a predetermined frequency range, the feedback signal input 504 is a subset of the frequency range of the second real audio signal input 508 with which it is mixed.

As a result of mixing the first and second real audio input signals 506 and 508 with the feedback input signal 504, the crossbar matrix mixer 302 produces real audio output signals at block 722. In this example, the feedback input signal 504 may be mixed, or combined, with the pre-processed first real audio input signal 506 at predetermined gains to produce a first real audio output signal, and mixed with the pre-processed second real audio input signal 508 at predetermined gains to produce a second real audio output signal. Due the inclusion of the feedback input signal 504, a predetermined frequency range of the first real audio output signal is included in the second real audio output signal, and a predetermined frequency range of the second real audio output signal is included in the first real audio output signal. In other examples, other mixes are possible.

At block 724, the real audio output signals are post processed with the real post processor blocks 412. The post processed real audio output signals are provided as audio signals on the amplifier input signal lines 256 at block 726. In this example, the audio signals are respective first and second audio signals that are made available to drive respective first and second loudspeakers to produce sound in respective first and second sound zones. The first audio signal includes a predetermined frequency range of the second audio signal, and the second audio signal includes a predetermined frequency range of the first audio signal.

The signal magnitude control block 220 in the pre-processor block 204 may be adjusted at block 728, such as by a user, to attenuate, or minimize, the signal strength of the second real audio input signal 508, such as, by adjusting the balance control. Such adjustment may be performed when processing is being initialized, during operation or any other time. As a result, the second real audio input signal 508 is no longer available and the crossbar matrix mixer 302 performs mixing without the attenuated second real audio input signal at block 730. Accordingly, in this example, the virtual output signal is not mixed to include the second real audio input signal 508 and the second real audio output signal only includes the feedback input signal mixed at the respective predetermined gain. Since the virtual output signal is mixed from only the first real audio input signal 506, the second real audio output signal includes only a determined frequency range of the first real audio output signal. The second real audio input signal may not be attenuated completely in other examples.

Figure 8:
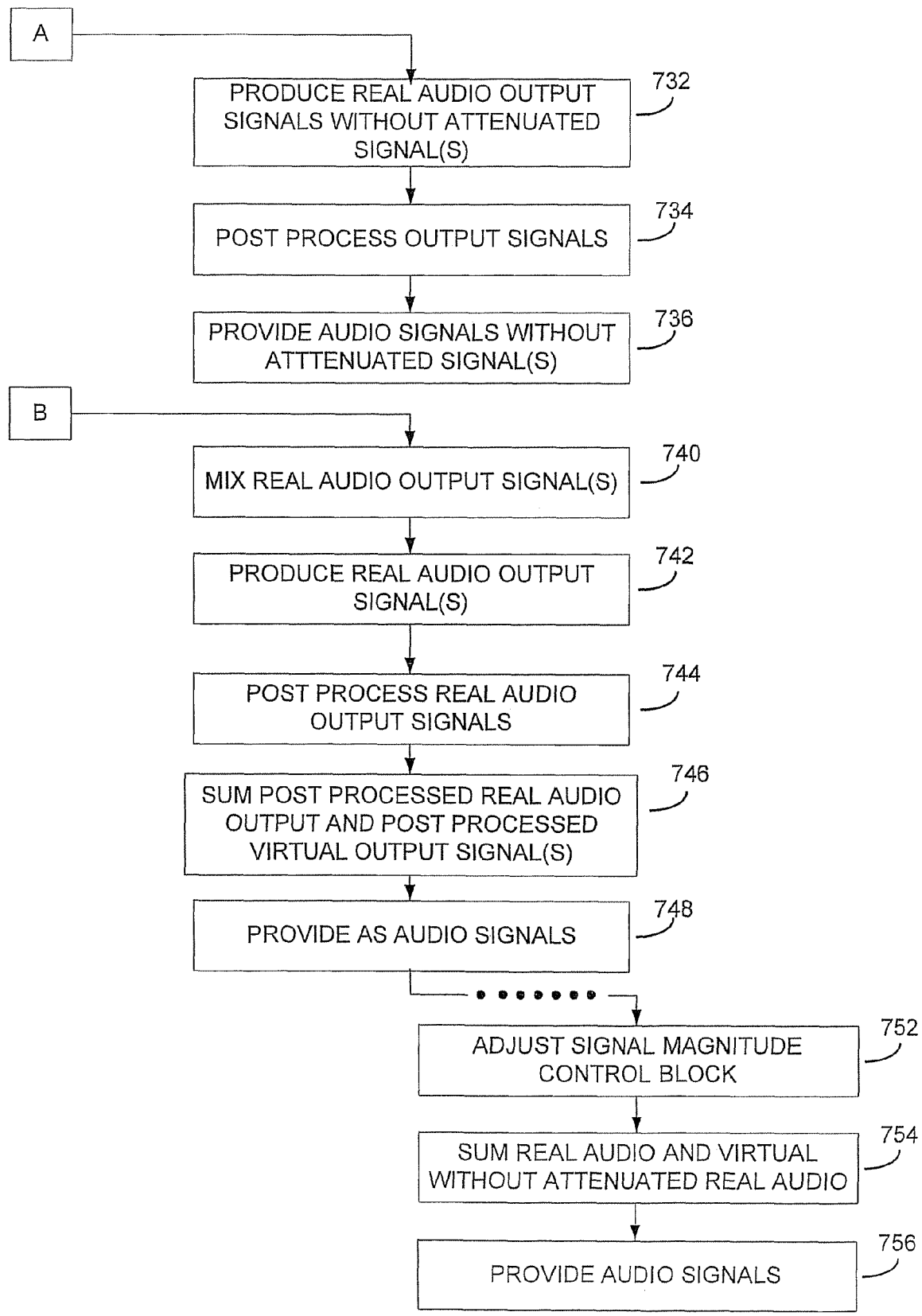
FIG. 8 is a second part of the flow chart of FIG. 7.

Referring to FIG. 8, at block 732, the real audio outputs signals are produced without the attenuated real audio input signal (second real audio input signal 508). The real audio output signals are post processed at block 734. At block 736, the audio signals are provided absent the effect of the attenuated real audio input signal. In this example, the first audio signal is formed from the combination of the feedback input signal 504 and the first real audio input signal 506, however, the second audio signal is formed from only the feedback input signal 504 because the second real audio input signal 508 is attenuated. Accordingly, the second loudspeaker in the second sound zone is driven only by the predetermined frequency range of the feedback input signal 504, which is a predetermined frequency range of the first audio signal that is a subset of the frequency range of the now attenuated second audio signal.

Referring again to block 714 of FIG. 7, where the feedback input signal is not used, the real audio input signals are mixed by the crossbar matrix mixer 302 at block 740 of FIG. 8. At block 742, the crossbar matrix mixer 302 produces the real audio output signals on the real audio output channels 406. The real audio output signals are post processed with the real post processing blocks 412 at block 744. At block 746, the post processed real audio output signals are summed with the post processed virtual output signal(s) by the summers 608. The summers 608 provide the sum of the post processed real audio output signals and the post processed virtual output signal(s) as the audio output signals on the amplifier input signal lines 256 at block 748. The audio signals are available to drive respective loudspeakers.

The signal magnitude control block 220 in the post processing block 304 may be adjusted at block 752, such as by a user, to attenuate, or minimize, the signal strength of the second real audio input signal 508, such as, by adjusting the balance control. Such adjustment may be performed when processing is being initialized, during operation or any other time. As a result, the second real audio input signal 508 is no longer available and the second real audio output signal mixed by the crossbar matrix mixer 302 is attenuated to zero. In addition, the virtual output signal is mixed without the second real audio input signal 508. The signal magnitude control block 220 of this example does not effect the virtual output signal and the summer 608 sums, or combines, the post processed virtual output signal with zero based on the attenuated second real audio output signal 508 at block 754. In other examples, the second real audio input signal 508 may not be attenuated completely.

At block 756, the output signals provided by the summers 608 include the post processed virtual output signal, but not the second real audio output signal. Accordingly, a loudspeaker driven by that output signal would be driven by only the post processed virtual output signal, or a predetermined frequency range of at least one of the non-attenuated audio signals available to drive other loudspeakers. In this example, the post processed virtual output signal is a filtered, predetermined low frequency range audio signal formed from only the first real audio input signal 506. Accordingly, the loudspeaker is driven to produce a low frequency audio output even though the balance control has been adjusted to otherwise minimize the audio output from the loudspeaker.

The previously discussed sound processor generates a virtual output signal(s) and real audio output signals from pre-processed real audio input signals using the crossbar matrix mixer 302. The virtual output signal is post processed and either provided as a feedback input signal to the crossbar matrix mixer 302 or as a post processed virtual output signal to the summer 602. In an example application, the post processed virtual output signal is mixed from the real audio input signals and filtered during post processing to provide a predetermined frequency range signal. The predetermined frequency may be a low frequency range to provide bass summing. When the signal magnitude control block 220 is adjusted to minimize one or more of the real audio output signals driving a loudspeaker, the loudspeaker may continue to be driven by the predetermined frequency range signal. Accordingly, the loudspeaker may continue to produce a low frequency audio output when the audio signal to the loudspeaker has otherwise been attenuated.

Alternatively, the real audio input signal may be mixed to produce a real audio output signal and a virtual output signal. The real audio output signal and the virtual output signal may be separately filtered and delayed during post processing so that different frequency bands may be independently phase delayed. The separately processed real audio output signal and the virtual output signal can be combined by the summer 608 to form a single audio output signal available to drive a single loudspeaker having multiple transducers. The resulting frequency dependent phase delay may be adjusted to enhance the audible sound.

While various embodiments of the invention have been described, it will be apparent to those of ordinary skill in the art that more embodiments and implementations are possible that are within the scope of the invention.

What is claimed is:

1. A sound processor for use in a vehicle audio sound processing system, the sound processor comprising:
a mixing block configured to separate a real audio input signal into a first predetermined frequency range and a second predetermined frequency range,
where the mixing block is configured to filter the first predetermined frequency range independent of the second predetermined frequency range;
where the mixing block is further configured to apply a first time delay to the first predetermined frequency range, and a second time delay to the second predetermined frequency range, the first time delay different than the second time delay; and
where the mixing block is configured to re-combine the first and second predetermined frequency ranges to produce an audio signal available to drive a loudspeaker.

2. The sound processor of claim 1, where the first predetermined frequency range is a different range of frequency than the second predetermined frequency range.

3. The sound processor of claim 1, where the first predetermined frequency range is a portion of the frequency range of the audio signal and the second predetermined frequency range is the rest of the frequency range of the audio signal.

4. The sound processor of claim 1, where the audio signal is a single audio signal and the loudspeaker is a single loudspeaker.

5. The sound processor of claim 1, where the first predetermined frequency range is a real audio output signal and the second predetermined frequency range is a virtual audio output signal.

6. The sound processor of claim 1, where the loudspeaker includes a first transducer and a second transducer, the first predetermined frequency range is configured to drive the first transducer, and the second predetermined frequency range is configured to drive the second transducer.

7. The sound processor of claim 1, where the mixing block comprises a crossbar mixer, a post processor and a summer, the crossbar mixer configured to separate the real audio input signal, the post processor configured to delay the first and second predetermined frequency ranges differently and the summer configured to re-combine the first and second predetermined frequency ranges.

8. The sound processor of claim 1, where first and second time delays are operable, via the loudspeaker being driven by the audio signal, to independently control arrival of the first predetermined frequency range and the second predetermined frequency range at a listening position.

9. The sound processor of claim 1, where the first predetermined frequency range has a time relationship to the second predetermined frequency range, the time relationship being different in the audio signal to drive the loudspeaker due to the first and second time delays.

10. A sound processor for use in a vehicle audio sound processing system, the sound processor comprising:
a memory device;
instructions stored in the memory device to process an audio signal configured to drive a loudspeaker;
instructions stored in the memory device to filter the audio signal to obtain a first predetermined frequency range of the audio signal and a second predetermined frequency range of the audio signal, where the first predetermined frequency range and the second predetermined frequency range are different;
instructions stored in the memory device to separately process at least one of the first predetermined frequency range and the second predetermined frequency range;
instructions stored in the memory device to recombine the first predetermined frequency range and the second predetermined frequency range to produce an output signal to drive the loudspeaker; and
instructions stored in the memory device to independently delay the first predetermined frequency range and the second predetermined frequency range to control the phase of the first predetermined frequency range with respect to the second predetermined frequency range.

11. The sound processor of claim 10, further comprising instructions stored in the memory device to recombine the first predetermined frequency range and the second predetermined frequency by summation with a summer.

12. A sound processor for use in a vehicle audio sound processing system, the sound processor comprising:
a memory device;
instructions stored in the memory device to process an audio signal configured to drive a loudspeaker;
instructions stored in the memory device to filter the audio signal to obtain a first predetermined frequency range of the audio signal and a second predetermined frequency range of the audio signal, where the first predetermined frequency range and the second predetermined frequency range are different;
instructions stored in the memory device to separately process at least one of the first predetermined frequency range and the second predetermined frequency range;
instructions stored in the memory device to recombine the first predetermined frequency range and the second predetermined frequency range to produce an output signal to drive the loudspeaker; and
instructions stored in the memory device to provide the first predetermined frequency range as a feedback signal to a crossbar matrix mixer, and instructions to mix the second predetermined frequency range and the feedback signal with the crossbar matrix mixer to produce the output signal.

13. The sound processor of claim 12, further comprising instructions stored in the memory device to delay the second predetermined frequency range to maintain phase alignment of the feedback signal and the second predetermined frequency range.

14. A sound processor for use in a vehicle audio sound processing system, the sound processor comprising:
a memory device;
instructions stored in the memory device to process an audio signal configured to drive a loudspeaker;
instructions stored in the memory device to filter the audio signal to obtain a first predetermined frequency range of the audio signal and a second predetermined frequency range of the audio signal, where the first predetermined frequency range and the second predetermined frequency range are different;
instructions stored in the memory device to separately process at least one of the first predetermined frequency range and the second predetermined frequency range; and
instructions stored in the memory device to recombine the first predetermined frequency range and the second predetermined frequency range to produce an output signal to drive the loudspeaker;
wherein the audio signal is a plurality of audio signals, and the first predetermined frequency range is a respective plurality of first predetermined frequency ranges and the second predetermined frequency range is a respective plurality of second predetermined frequency ranges, and the instructions stored in the memory device to combine the first predetermined frequency range and the second predetermined frequency range are configured to selectively combine at least one of the plurality of first predetermined frequency ranges and at least one of the plurality of second predetermined frequency ranges.

* * * * *